US011158579B2

(12) United States Patent
Lee et al.

(10) Patent No.: US 11,158,579 B2
(45) Date of Patent: Oct. 26, 2021

(54) SEMICONDUCTOR PACKAGE INCLUDING A BACKSIDE REDISTRIBUTION LAYER

(71) Applicant: SAMSUNG ELECTRONICS CO., LTD., Suwon-si (KR)

(72) Inventors: Han Ul Lee, Suwon-si (KR); Young Gwan Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 118 days.

(21) Appl. No.: 16/561,276

(22) Filed: Sep. 5, 2019

(65) Prior Publication Data

US 2020/0144191 A1    May 7, 2020

(30) Foreign Application Priority Data

Nov. 1, 2018  (KR) .................... 10-2018-0132775

(51) Int. Cl.
| H01L 23/538 | (2006.01) |
| H01L 23/31 | (2006.01) |
| H01L 23/00 | (2006.01) |
| H01L 21/48 | (2006.01) |
| H01L 21/56 | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2224/214* (2013.01)

(58) Field of Classification Search
CPC ............. H01L 23/5389; H01L 21/4853; H01L 21/4857
See application file for complete search history.

(56) References Cited

U.S. PATENT DOCUMENTS 9,972,581 B1* 5/2018 Yu ........................ H01L 23/5383
2010/0078213 A1 4/2010 Furutani et al.
(Continued)

FOREIGN PATENT DOCUMENTS

| JP | 2000-349437 A | 12/2000 |
| KR | 10-2011-0017912 A | 2/2011 |
| KR | 10-2018-0024834 A | 3/2018 |

*Primary Examiner* — Lex H Malsawma
*Assistant Examiner* — Xia L Cross
(74) *Attorney, Agent, or Firm* — Sughrue Mion, PLLC

(57) ABSTRACT

A semiconductor package includes a frame having a cavity and having a wiring structure connecting first and second surfaces opposing each other; a connection structure disposed on the first surface of the frame and including a first redistribution layer connected to the wiring structure; a semiconductor chip disposed in the cavity and having a connection pad connected to the first redistribution layer; an encapsulant encapsulating the semiconductor chip; and a second redistribution layer having a redistribution pattern and a connection via connecting the wiring structure and the redistribution pattern. The connection via includes a first via connected to the wiring structure and a second via disposed on the first via and connected to the redistribution pattern, a lower surface of the second via has an area larger than an area of an upper surface of the first via.

17 Claims, 30 Drawing Sheets

(56) References Cited

U.S. PATENT DOCUMENTS

| | | | |
|---|---|---|---|
| 2013/0026632 A1* | 1/2013 | Kikuchi | H01L 23/552 257/753 |
| 2014/0124949 A1* | 5/2014 | Paek | H01L 22/14 257/774 |
| 2016/0133601 A1* | 5/2016 | Ko | H01L 24/20 257/738 |
| 2017/0133309 A1* | 5/2017 | Kim | H01L 24/19 |
| 2018/0061794 A1 | 3/2018 | Kim et al. | |

* cited by examiner

SEMICONDUCTOR PACKAGE INCLUDING A BACKSIDE REDISTRIBUTION LAYER

CROSS-REFERENCE TO RELATED APPLICATION

This application claims benefit of priority to Korean Patent Application No. 10-2018-0132775 filed on Nov. 1, 2018 in the Korean Intellectual Property Office, the disclosure of which is incorporated herein by reference in its entirety.

TECHNICAL FIELD

The present disclosure relates to a semiconductor package.

BACKGROUND

One of the major trends in the development of technology related to semiconductor chips in recent years is to reduce the size of components, and in the field of packages as well, compact semiconductor chips with multiple pins to ensure a compact size are required to be realized as demand therefor has increased.

In order to meet the demand, a fan-out semiconductor package has been proposed. In the fan-out semiconductor package, connection terminals may be redistributed even in a region outside a region overlapping a semiconductor chip, thus realizing multiple pins, while having a compact size. Some semiconductor packages may require a backside redistribution layer (RDL). However, such a backside RDL requires additional lithography as a separate line process.

SUMMARY

An aspect of the present disclosure may provide a semiconductor package having a redistributed layer which may be realized through a simplified process.

According to an aspect of the present disclosure, a semiconductor package may include: a frame having a cavity and having a wiring structure connecting first and second surfaces configured to oppose each other; a connection structure disposed on the first surface of the frame and including a first redistribution layer connected to the wiring structure; a semiconductor chip disposed on the connection structure in the cavity and having a connection pad connected to the first redistribution layer; an encapsulant encapsulating the semiconductor chip located in the cavity and covering the second surface of the frame; and a second redistribution layer having a redistribution pattern embedded in the encapsulant and exposed in one surface thereof and a connection via connecting the wiring structure and the redistribution pattern through the encapsulant. The connection via may include a first via connected to the wiring structure and a second via disposed on the first via and connected to the redistribution pattern, a lower surface of the second via may have an area larger than an area of an upper surface of the first via, and the first and second vias may have an integrated structure.

According to another aspect of the present disclosure, a semiconductor package may include: a frame having a cavity and having a wiring structure connecting first and second surfaces configured to oppose each other; a connection structure disposed on the first surface of the frame and including a first redistribution layer connected to the wiring structure; a semiconductor chip disposed on the connection structure in the cavity and having a connection pad connected to the first redistribution layer; an encapsulant encapsulating the semiconductor chip located in the cavity and covering the second surface of the frame; and a second redistribution layer having a redistribution pattern embedded in the encapsulant and exposed in one surface thereof and a connection via connecting the wiring structure and the redistribution pattern through the encapsulant. The connection via may include a first via connected to the wiring structure and a second via disposed on the first via, having the center offset from the center of the first via, and connected to the redistribution pattern.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
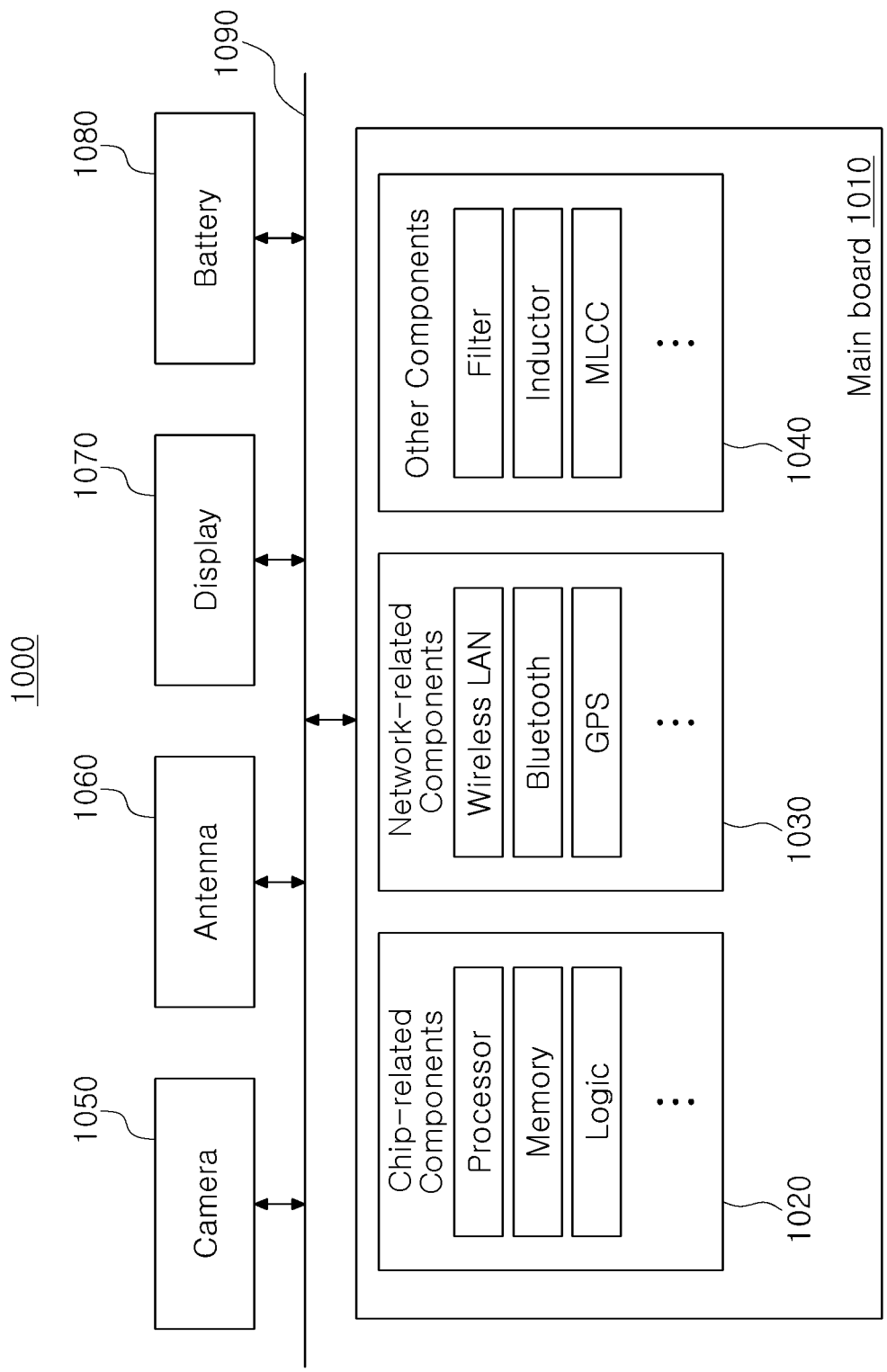
FIG. 1 is a schematic block diagram illustrating an example of an electronic device system.

Exemplary embodiments of the present disclosure will now be described in detail with reference to the accompanying drawings.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Hereinafter, exemplary embodiments in the present disclosure will be described in detail with reference to the accompanying drawings.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
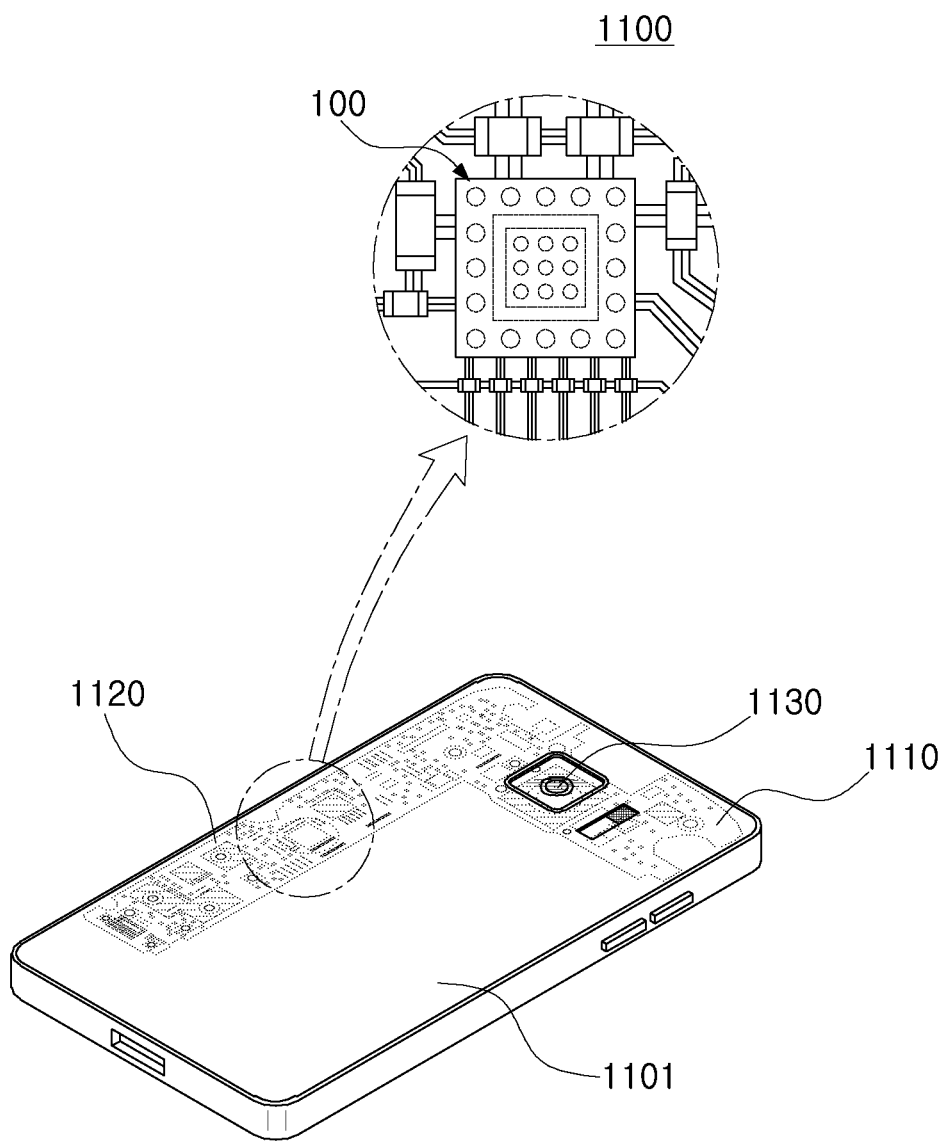
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and use of packaging technology for buffering a difference in a circuit width between the semiconductor and the mainboard is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
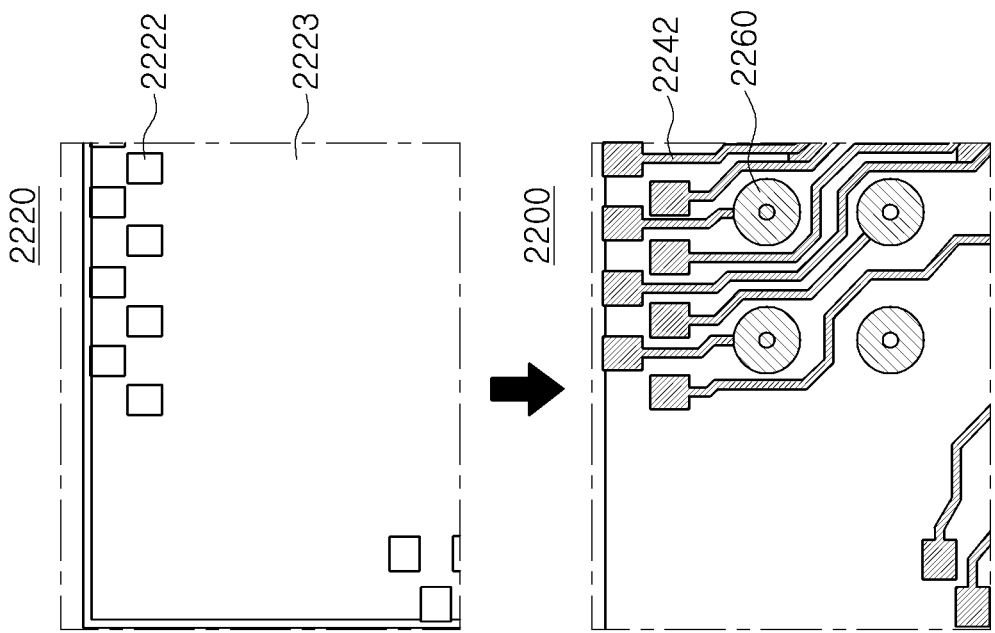
FIGS. 3A and 3B are schematic cross-sectional views illustrating states of a fan-in semiconductor package before and after being package.
Figure 3A:
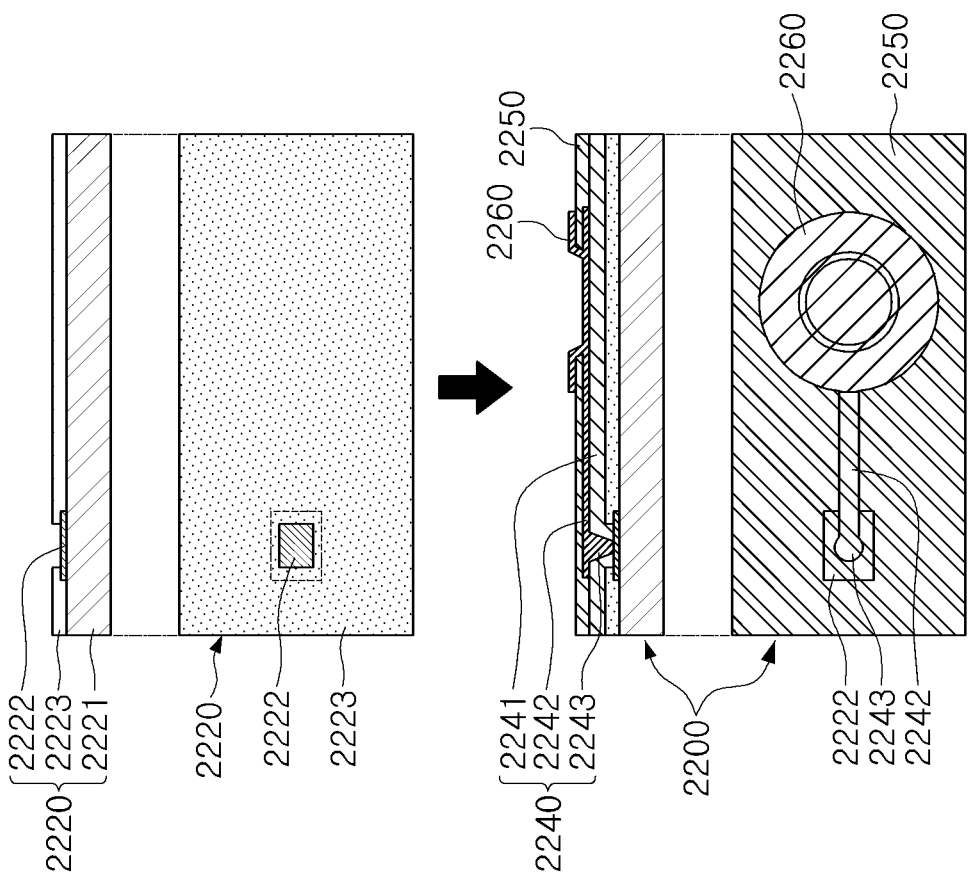
Figure 4:
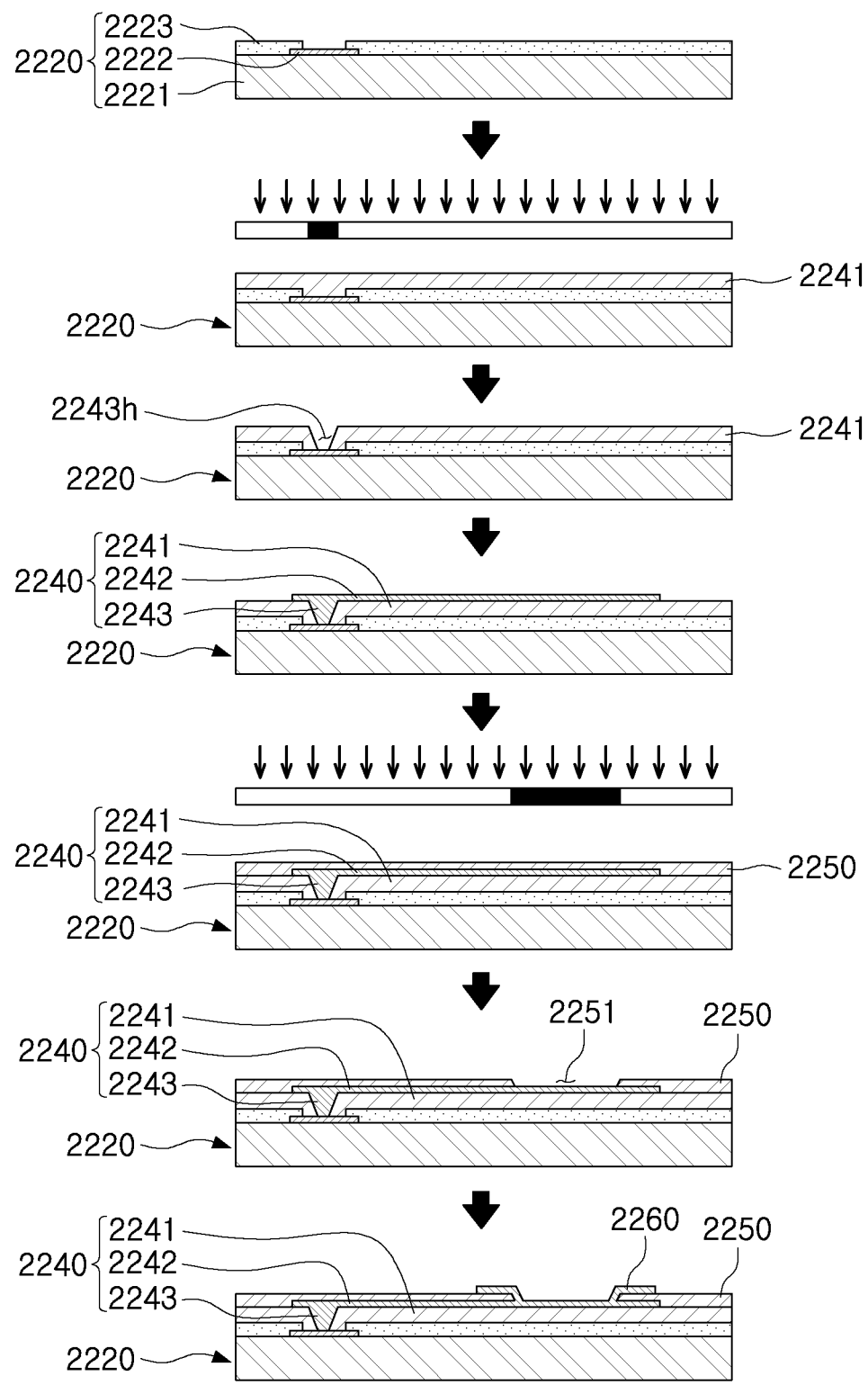
FIG. 4 is a schematic cross-sectional view illustrating a packaging process of a fan-in semiconductor package

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the mainboard of the electronic device, or the like.

Therefore, depending on a size of the semiconductor chip 2220, a connection structure 2240 may be formed on the semiconductor chip 2220 in order to redistribute the connection pads 2222. The connection structure 2240 may be formed by forming an insulating layer 2241 on the semiconductor chip 2220 using an insulating material such as a photo imageable dielectric (PID) resin, forming via holes 2243 opening on to the connection pads 2222, and then forming wiring patterns 2242 and vias 2243. Then, a passivation layer 2250 protecting the connection structure 2240 may be formed, and an opening 2251 may be formed to have an underbump metal layer 2260, or the like, extending therethrough. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the mainboard of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
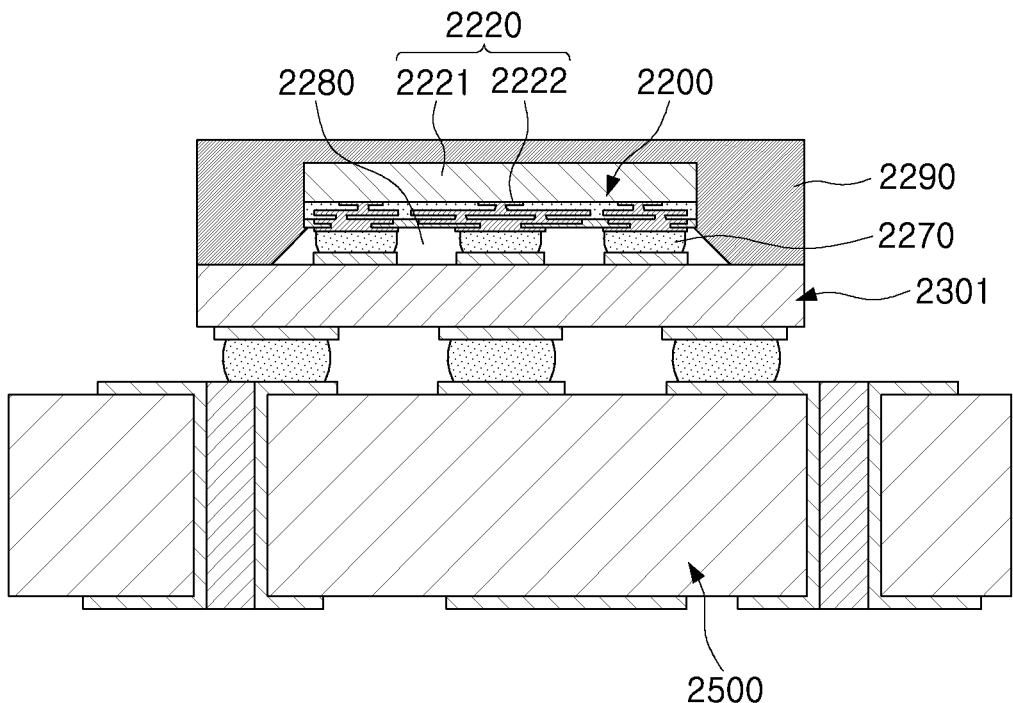
FIG. 5 is a schematic cross-sectional view illustrating a case in which a fan-in semiconductor package is mounted on an interposer substrate and is ultimately mounted on a mainboard of an electronic device.
Figure 6:
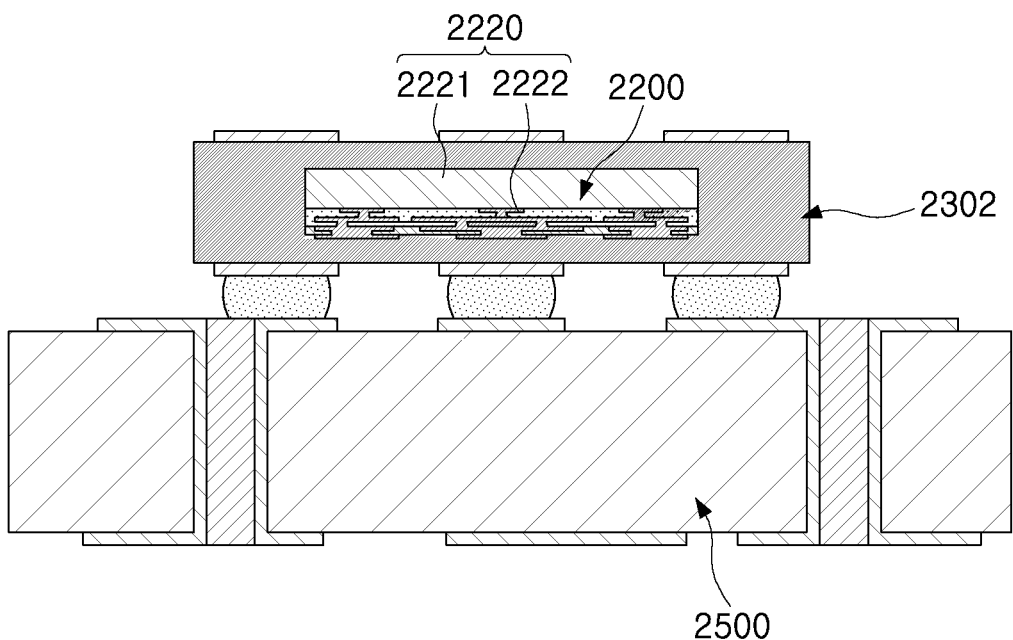
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a fan-in semiconductor package mounted on an interposer substrate that is ultimately mounted on a mainboard of an electronic device, and FIG. 6 is a schematic cross-sectional view illustrating a fan-in semiconductor package embedded in an interposer substrate that is ultimately mounted on a mainboard of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard (e.g., 2500) of the electronic device. Therefore, the fan-in semiconductor package may be mounted on the separate interposer substrate (e.g., 2301 or 2302) and be then mounted on the mainboard of the electronic device through a packaging process or may be mounted and used on the mainboard of the electronic device in a state in which it is embedded in the interposer substrate.

Fan-Out Semiconductor Package

Figure 7:
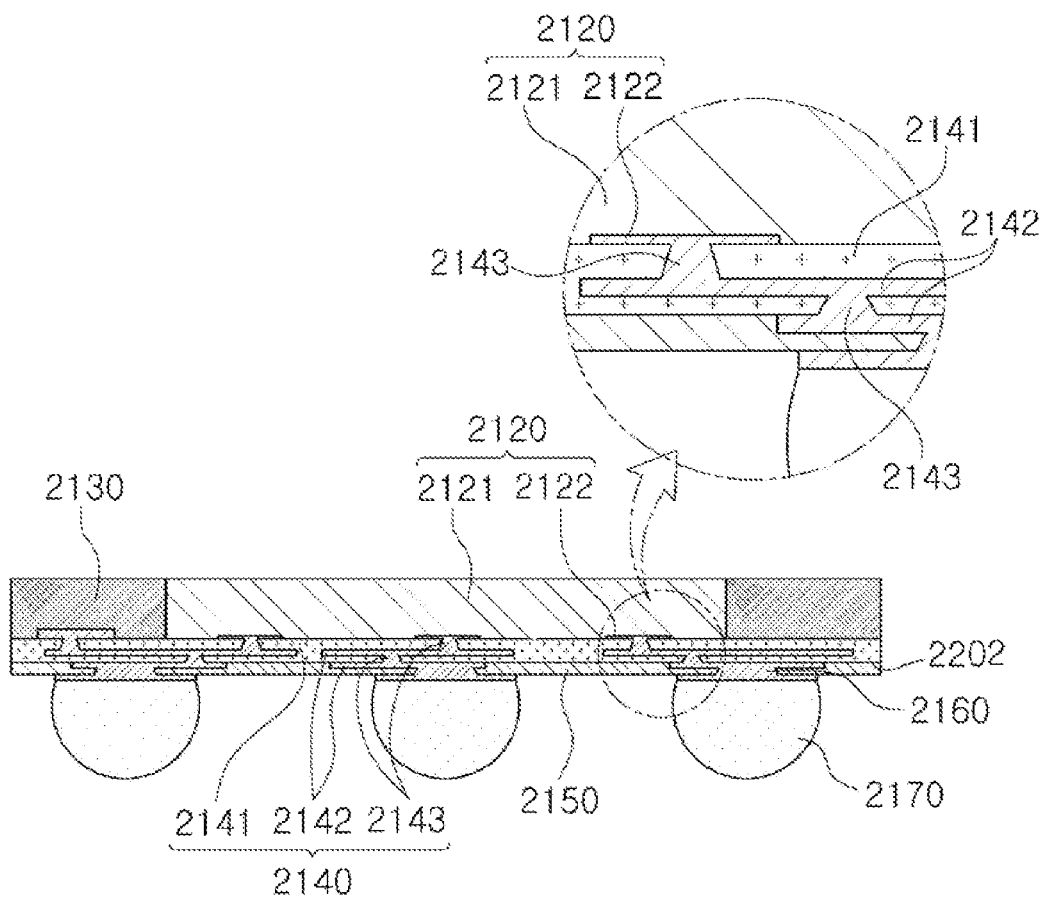
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may be further formed on the connection structure 2140, and an underbump metal layer 2160 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection structure 2140 may be formed after the encapsulant 2130 is formed outside the semiconductor chip 2120. In this case, a process for forming the connection structure 2140 is performed from the via(s) connected to the connection pads 2122 of the semiconductor chip 2120 and the redistribution layer, and thus, the vias 2143 may have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection structure 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. Meanwhile, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection structure 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the mainboard of the electronic device without using a separate interposer substrate, as described below.

Figure 8:
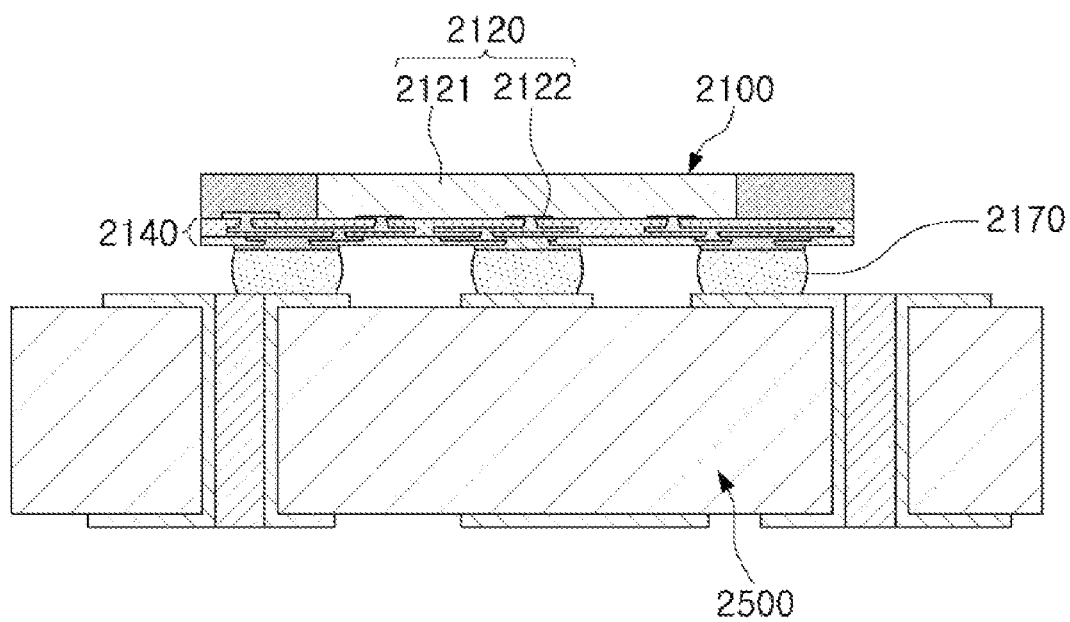
FIG. 8 is a schematic cross-sectional view illustrating a case in which a fan-out semiconductor package is mounted on a mainboard of an electronic device.

FIG. 8 is a schematic cross-sectional view illustrating a fan-out semiconductor package mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the mainboard of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
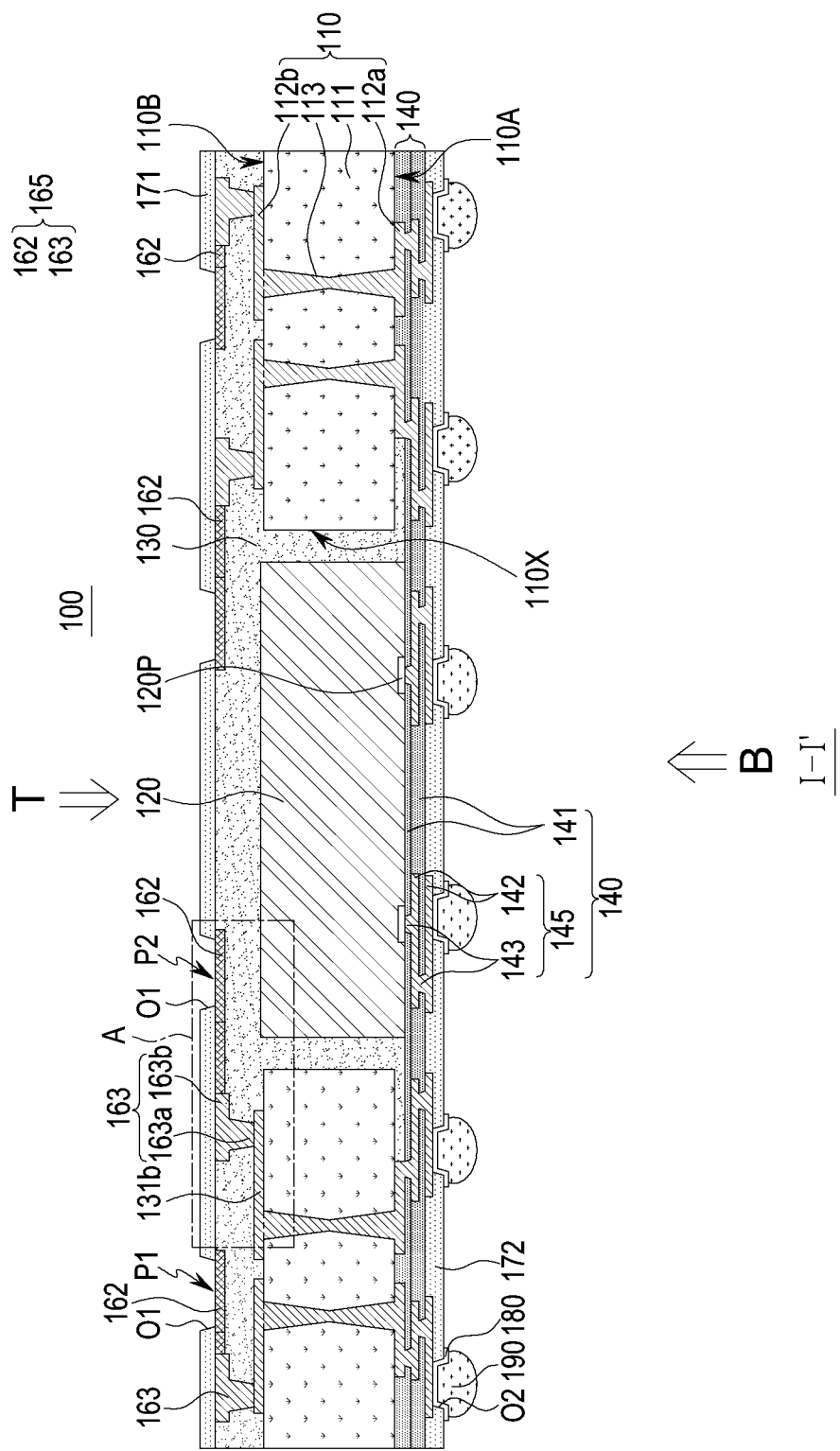
FIG. 9 is a side cross-sectional view illustrating a semiconductor package according to an exemplary embodiment in the present disclosure.
Figure 10A:
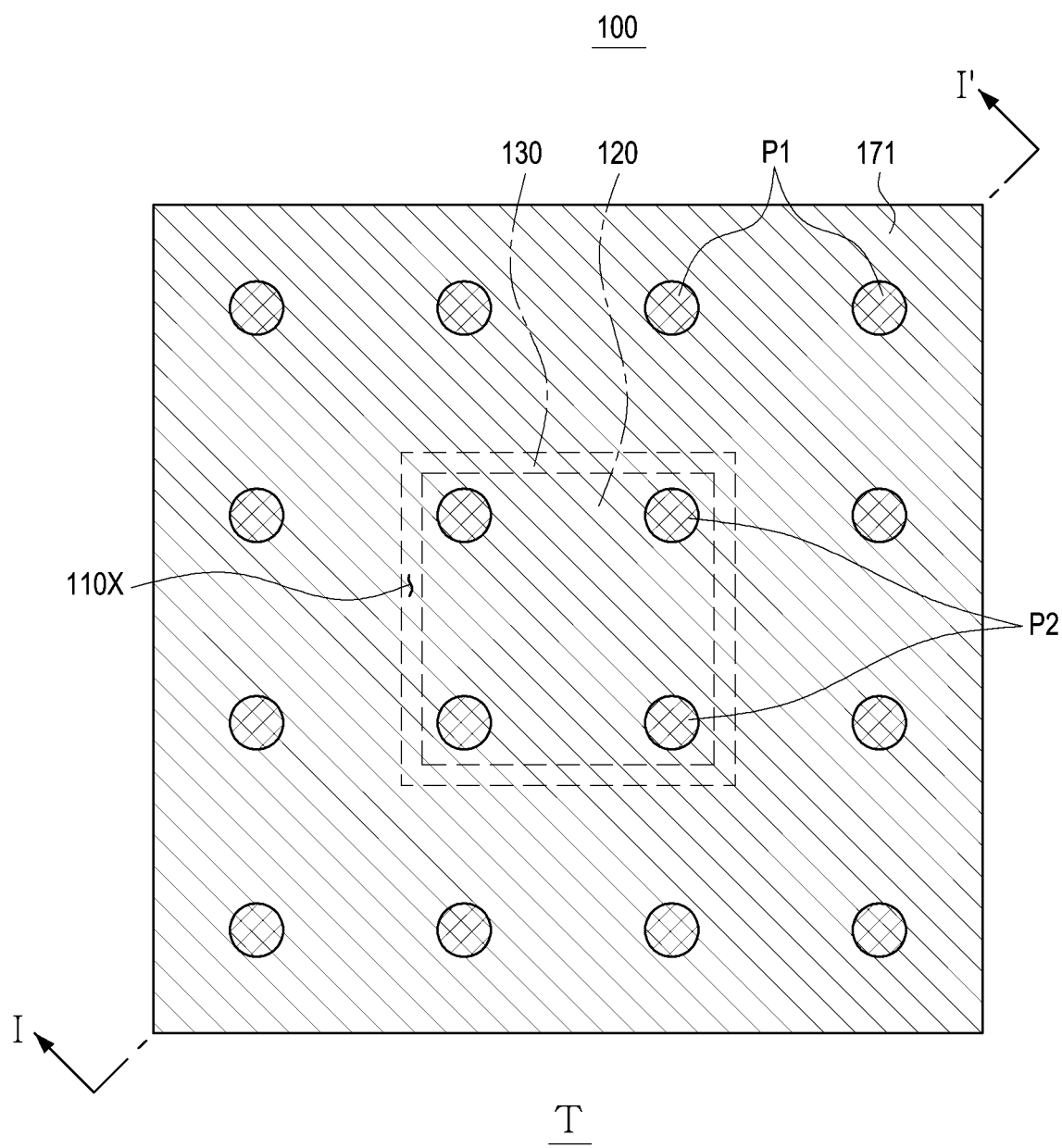
FIGS. 10A and 10B are a plan view and a bottom view illustrating the semiconductor package illustrated in FIG. 9.
Figure 10B:
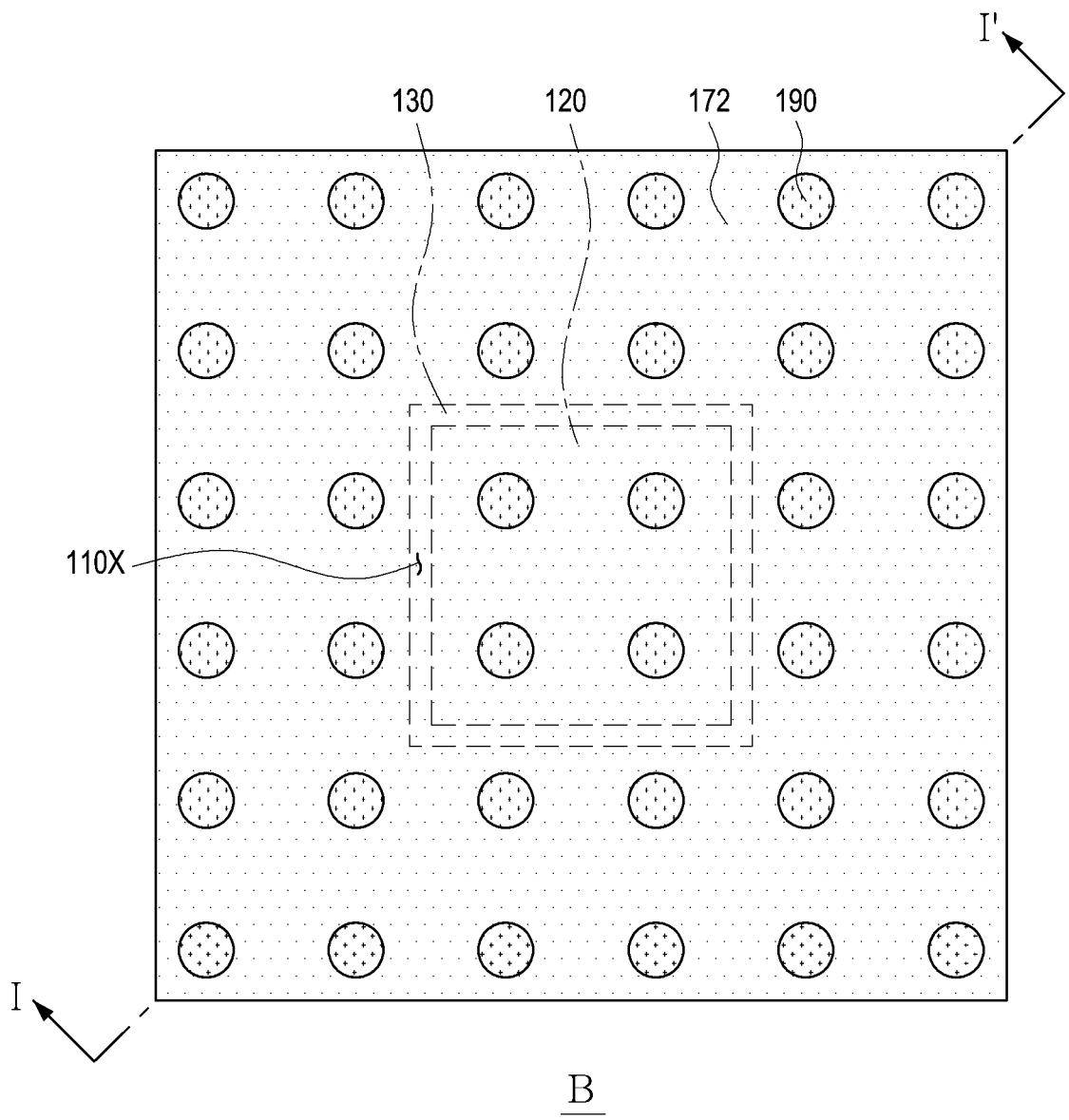

FIG. 9 is a side cross-sectional view illustrating a semiconductor package according to an exemplary embodiment in the present disclosure, and FIGS. 10A and 10B are a top view ("T" directional view) and a bottom view ("B" directional view) illustrating the semiconductor package illustrated in FIG. 9.

Referring to FIG. 9, a semiconductor package 100 according to the present exemplary embodiment includes a frame 110 having a cavity 110X and a first surface 110A and a second surface 110B opposing each other, a semiconductor chip 120 disposed in the cavity 110X, a connection structure 140 disposed below the first surface 110A of the frame 110 and the semiconductor chip 120, and an encapsulant 130 encapsulating the semiconductor chip 120 located in the cavity 110X and covering the second surface 110B of the frame 110.

The frame 110 includes an insulating member 111 and a wiring structure connecting the first surface 110A and the second surface 110B. In this embodiment, the wiring structure may include a first wiring pattern 112a and a second wiring pattern 112b respectively disposed on the first surface 110A and the second surface 110B of the frame 110, and a through via 113 connecting the first and second wiring patterns 112a and 112b.

The connection structure 140 includes an insulating layer 141 and a first redistribution layer 145 formed on the insulating layer 141. The first redistribution layer 145 includes a first redistribution pattern 142 disposed on the insulating layer and a via 143 connected to the first redistribution pattern 142 through the insulating layer 141. The first redistribution layer 145 may be connected to a wiring structure (in particular, the first wiring pattern 112a) of the frame 110, and a connection pad 120P of the semiconductor chip 120 by a via 143. The first redistribution layer 145 employed in the present exemplary embodiment is illustrated as having a two-level structure disposed on each of two insulating layers 141 but is not limited thereto and may have a one-level structure or three or more level structure.

The semiconductor package 100 according to the present exemplary embodiment includes a second redistribution layer 165 having a second redistribution pattern 162 (hereinafter, referred to as a "redistribution pattern") and a connection via 163, as a backside redistribution layer. The second redistribution pattern 162 is embedded in the encapsulant 130 such that one surface of the second redistribution pattern 162 is exposed from an upper surface of the encapsulant 130. The connection via 163 may penetrate through the encapsulant 130 to connect the second redistribution pattern 162 to the wiring structure of the frame 110 (in particular, the second wiring pattern 112b). The second redistribution pattern 162 may be connected to the second wiring pattern 112b through the connection via 163 and may be connected to the first redistribution layer 145 and the semiconductor chip 120 through the wiring structure of the frame 110.

Figure 11A:
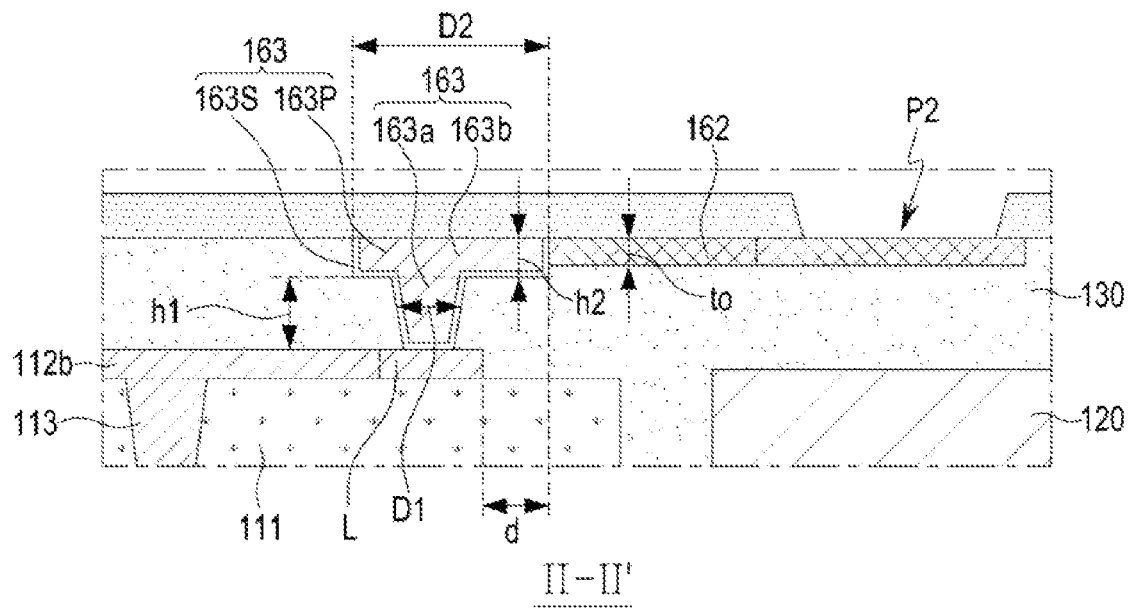
FIGS. 11A and 11B are an enlarged side cross-sectional view and an enlarged plan view, respectively, illustrating a partial region (portion A) of the semiconductor package illustrated in FIG. 9, respectively.
Figure 11B:
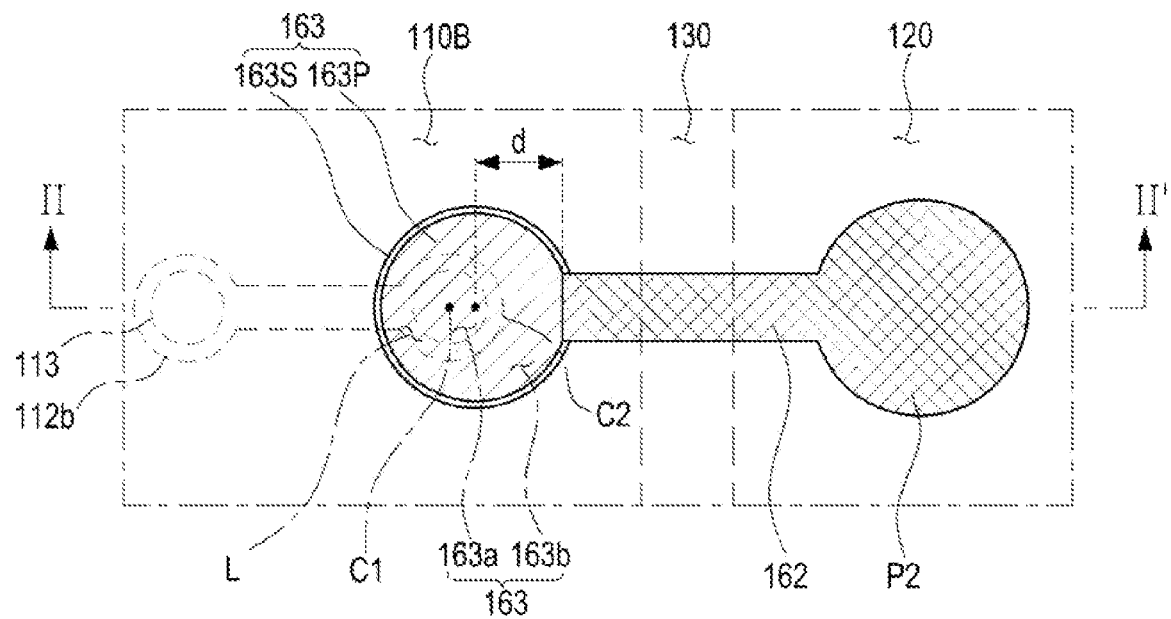

Referring to FIGS. 11A and 11B, the structure of the second redistribution layer 165 employed in this exemplary embodiment will be described in more detail. FIGS. 11A and 11B are an enlarged cross-sectional view and an enlarged partial plan view, respectively, illustrating a region indicated by "A" in the semiconductor package illustrated in FIG. 9. FIG. 11A is a side cross-sectional view taken along line II-II' in FIG. 11B, illustrating a cross section connecting the contacts of a land L and the second redistribution layer 162 connected to the connection via 163.

Referring to FIGS. 11A and 11B, the second redistribution pattern 162 is embedded in the encapsulant 130 such that one surface thereof is exposed, and the exposed surface of the second redistribution pattern 162 may be substantially coplanar with the surface of the encapsulant 130, but is not limited thereof. For example, the exposed surface of the second redistribution layer 162 may be located slightly higher or slightly lower than the surface of the encapsulant 130.

The connection via 163 includes a first via 163a connected to the second wiring pattern 112b of the wiring structure and a second via 163b disposed on the first via 163a and extending in a horizontal direction so as to be connected to the second redistribution layer 162. Since the second via 163b extends to be connected to the second redistribution layer 162, the second via 163 has a lower surface having an area (or width) greater than that of an upper surface of the first via 163a. Referring to FIG. 11A, the first and second vias 163a and 163b have a discontinuous side profile and the second via 163b may be expressed as having a width D2 (or diameter) greater than a width D1 (or diameter) of the first via 163a.

Also, the first and second vias 163a and 163b employed in this exemplary embodiment have a discontinuous side profile but have an integrated structure.

In this disclosure, the term "integrated structure" does not mean that two elements are simply in contact with each other but refers to a structure formed integrally using the same metal through the same process. For example, when the first via 163a and the second via 163b are formed together through the same plating process, the first and second vias 163a and 163b may be integrated.

As illustrated in FIGS. 11A and 11B, the connection via 163 includes a seed layer 163S located at an interface with the encapsulant 130 and a plating layer 163P formed on the seed layer 163S. In this case, since the first and second vias 163a and 163b are integrally formed, they may be formed by one seed layer 163S. The seed layer 163S is formed to extend from a bottom surface and a side surface of the first via 163a to a side surface of the second via 163b. Further, the seed layer 163S may also be located at an interface between the second via 163b and the second redistribution pattern 162.

The second redistribution pattern 162 may be connected to a region of an outer periphery of the second via 163b. Since the connection via 163 employed in this exemplary embodiment is formed by a process different from the second redistribution pattern 162, an interface such as a grain boundary may be observed between the second via 163b and the second redistribution pattern 162.

The second via 163b has a relatively large area and serves as a land of the second redistribution pattern 162 for connection with the second wiring pattern 112b. Since the existing second redistribution pattern has a ring-shaped land, a narrow inlet of the ring is blocked before a hole is fully filled during plating for hole filling to generate a seam void in a connection via. In contrast, in this exemplary embodiment, a relatively extended inlet for filling is provided as with the second via 163b, and thus, occurrence of a seam void may be prevented (see FIGS. 15B and 15C).

The second via 163b may have a height h2 different from a thickness t0 of the second redistribution pattern 162. In this exemplary embodiment, it is illustrated that the height h2 of the second via 163b is slightly larger than the thickness t0 of the second redistribution pattern 162. However, since the second redistribution pattern 162 is formed through a process different from that of the second via 163b, the height h2 of the second via 163b may be slightly smaller than the thickness t0 of the second redistribution pattern 162 or may be substantially equal depending on each process. The height h2 of the second via 163b may be smaller than a height h1 of the first via 163a, but is not limited thereto.

As illustrated in FIG. 11B, the second via 163b may be provided as a land of the second redistribution pattern 162, and the first via 163a may be connected to the second via 163b and provided as a connection part with the land L of the second wiring pattern 112b. A center C2 of the second via 163b may be offset from a center C1 of the first via 163a. The center C2 of the second via 163b may be closer to a connected portion of the second redistribution pattern 162 than the center C1 of the first via 163a.

A matching error may occur in a lamination process of embedding the second redistribution pattern 162 in the encapsulant 130. Considering such an error, the land L of the second wiring pattern 112b, which is a connection target, needs to be formed to have a size (e.g., a diameter of 200 μm or greater) significantly larger than a size (diameter of 150 μm or smaller) of a general land, and in this case, design freedom of the second wiring pattern 112b may be significantly restricted. The present exemplary embodiment provides a method for solving the problem of matching error by providing a connection via 163 having a multi-stage structure instead of extending the land L of the second wiring pattern 112b. Specifically, the first via 163a may be used to be precisely connected to the land L of the second wiring pattern 112b, and the second via 163b having an expanded area may be used to be connected to the second redistribution pattern 162.

In this manner, the connection via employed in this exemplary embodiment suppresses occurrence of a seam void and eliminates the necessity of expanding the land of the wiring pattern in consideration of a matching error, advantageously allowing a circuit pattern located at the land level to be formed with high density.

As illustrated in FIG. 10A, the second redistribution layer 165 may provide an array of a plurality of first and second pads P1 and P2 corresponding to an arrangement of connection terminals of another semiconductor chip/package to be disposed on the semiconductor package 100. Specifically, a first passivation layer 171 is formed on a surface of the encapsulant 130 on which the second redistribution layer 165 is formed. The first passivation layer 171 has a first opening O1 exposing a portion of the second redistribution pattern 162 and defining a region of the plurality of first and second pads P1 and P2, and the first opening O1 is formed to correspond to an arrangement of connection terminals of another semiconductor chip/package to be disposed on the semiconductor package 100. The plurality of first and second pads P1 and P2 are arranged as illustrated in FIG. 10A and may be divided into the first pad of a fan-out region and the second pad of a fan-in region.

Although the second redistribution layer 165 employed in this exemplary embodiment is illustrated as having a single layer structure, it may also be realized as having a multilayer structure including two or more layers using an insulating resin layer. In this exemplary embodiment, the second redistribution pattern is illustrated to be directly embedded in the encapsulant. However, in some exemplary embodiments, before the lamination process, an insulating resin layer such as ABF for embedding the second redistribution pattern may be formed in advance and the insulating resin layer and the encapsulant may be bonded.

Hereinafter, each component included in the semiconductor package 100 according to the present exemplary embodiment will be described in more detail.

The frame 110 may maintain rigidity of the semiconductor package 100. The semiconductor chip 120 may be disposed in the cavity 110X of the frame 110 and the semiconductor chip 120 may be fixed by the encapsulant 130. The frame 110 provides an extended routing region in the semiconductor package 100 and may improve design freedom of the semiconductor package 100. The wiring structure of the frame 110 employed in this exemplary embodiment is merely an example and may be modified to be realized in various forms. For example, the wiring structure may further include one or more patterns located at an intermediate level of the frame 110. For example, such a pattern may include a ground (GND) pattern, a power (PWR) pattern, and a signal pattern in addition to a pattern for redistribution. The wiring structure may be formed before the semiconductor chip 120 is disposed, thereby alleviating a problem of yield reduction due to the semiconductor chip 120.

The insulating member 111 of the frame 110 may include a thermosetting resin such as an epoxy resin, a thermoplastic resin such as polyimide, or a resin impregnated with a reinforcing agent such as glass fiber and/or an inorganic filler. For example, prepreg, ABF (Ajinomoto Build-up Film), FR-4, bismaleimide triazine (BT) resin, and the like, may be used. Alternatively, a photosensitive insulating material such as a photo imageable dielectric (PID) resin may be used. In another example, a metal having excellent rigidity and thermal conductivity may be used, and here, an Fe—Ni-based alloy may be used as the metal. Here, Cu plating may be formed on a surface of the Fe—Ni-based alloy in order to ensure adhesion with the encapsulant 130 and any other interlayer insulating materials, and the like. The insulating member 111 may be formed of glass, ceramics, plastic, or the like, but is not limited thereto. Meanwhile, the wiring structure may include a conductive material such as copper (Cu), aluminum (Al), silver (Ag), tin (Sn), gold (Au), nickel (Ni), lead (Pb), or alloys thereof, but is not limited thereto.

The connection structure 140 is basically a component for redistributing connection pads 120P of the semiconductor chip 120. Tens to hundreds of connection pads 120P having various functions may be redistributed through the connection structure 140 and may be physically and/or electrically connected to an external device through an electrical connection metal 190. The connection structure 140 is connected to the connection pad 120P of the semiconductor chip 120 and may support the semiconductor chip 120. The connection structure 140 may be directly electrically connected to the semiconductor chip 120 and the wiring structure of the frame 110 and the second redistribution layer 165 may be electrically connected to the semiconductor chip 120 by bypassing the first redistribution layer 145 of the connection structure 140.

As described above, the connection structure 140 includes the insulating layer 141 and a first redistribution layer 145 formed on the insulating layer 141. Similarly to other insulators described above, the insulating layer 141 may include a thermosetting resin such as an epoxy resin, a thermoplastic resin such as polyimide, or a resin having a reinforcing material such as an inorganic filler impregnated with the thermosetting resin and the thermoplastic resin, or a photosensitive insulating material such as a PID resin may be used.

The first and second redistribution layers 145 and 165 may include a conductive material such as copper (Cu), aluminum (Al), silver (Ag), tin (Sn), gold (Au), nickel (Ni), lead (Pb), or alloys thereof. A surface treatment layer may further be formed on exposed pad P1 and P2 regions of the second redistribution pattern 162 as necessary.

The encapsulant 130 is a component for protecting the semiconductor chip 120. In this exemplary embodiment, the encapsulant 130 encapsulates the second surface 110B of the frame 110 together with the semiconductor chip 120. An encapsulating form is not limited and may be any form that surrounds the semiconductor chip 120. For example, the encapsulant 130 may cover the semiconductor chip 120 and fill the other remaining space in the cavity 110X of the frame 110. Since the encapsulant 130 fills the cavity 110X, the encapsulant 130 may serve as an adhesive and serve to reduce buckling of the semiconductor chip 120. The encapsulant 130 may cover all surfaces excluding a lower surface of the semiconductor chip 120. Only a portion of the lower surface of the semiconductor chip 120 may be covered depending on a position and shape of the connection pad 120P of the semiconductor chip 120. In some exemplary embodiments, the encapsulant 130 may include a plurality of layers formed of a plurality of materials. For example, the space in the cavity 110X may be filled with a first encapsulant, and the first surface 110A of the frame 110 and the semiconductor chip 120 may be covered with a second encapsulant different from the first encapsulant.

The material of the encapsulant 130 is not limited. For example, a thermosetting resin such as an epoxy resin, a thermoplastic resin such as polyimide, and a resin having a reinforcing material such as glass fiber and/or inorganic filler, for example, prepreg, ABF, or the like, impregnated with the thermosetting resin and the thermoplastic resin may be used. In addition, a known molding material such as EMC may be used. In some exemplary embodiments, a material including glass fiber and/or an inorganic filler and an insulating resin may be used to effectively improve warpage.

In some exemplary embodiments, the encapsulant 130 may include conductive particles for electromagnetic shielding. For example, the conductive particles may include copper (Cu), aluminum (Al), silver (Ag), tin (Sn), gold (Au), nickel (Ni), lead (Pb), and/or solder, but are not limited thereto.

The semiconductor package 100 according to the present exemplary embodiment may further include a second passivation layer 172 disposed under the connection structure 140, similarly to the first passivation layer 171 disposed on the encapsulant 130 on which the second redistribution layer 165 is formed.

The first and second passivation layers 171 and 172 are configured to protect the second redistribution layer 165 and the connection structure 140 from external physical or chemical damage. The second passivation layer 172 has a second opening O2 that exposes at least a portion of the first redistribution pattern 142 of the connection structure 140, similarly to the first passivation layer 171 described above.

A material of the first and second passivation layers 171 and 172 is not particularly limited, and for example, a solder resist may be used. In some exemplary embodiments, a material which is the same or similar to the insulating material used for the frame 110 and/or the connection structure 140 (e.g., PID resin, ABF, etc.) may be used.

The semiconductor package 100 according to the present exemplary embodiment may further include the electrical connection metal 190 disposed at the second opening O2 of the second passivation layer 172 and exposed to the outside. The electrical connection metal 190 is configured to physically and/or electrically connect the semiconductor package 100 to the outside. For example, the semiconductor package 100 may be mounted on a motherboard of an electronic device through the electrical connection metal 190. The electrical connection metal 190 is connected to the first redistribution pattern 142 exposed by the second opening O2. In some exemplary embodiments, additional under bump metallurgy (UBM) layer 180 may be formed on first redistribution pattern 142 to form the electrical connection metal 190.

For example, the electrical connection metal 190 may be formed of a low melting point metal, e.g., tin (Sn) or an alloy including tin (Sn). The electrical connection metal 190 may have various structures such as a land, a ball, a pin, and the like, but is not limited thereto.

As illustrated in FIG. 10B, a portion of the electrical connection metal 190 may be disposed at the fan-out region. The fan-out package is superior in reliability to a fan-in package, has a plurality of I/O terminals, and facilitates 3D interconnection. The arrangement (number, spacing, etc.) of the connection terminals is not limited and may be variously modified depending on conditions of an external device on which the semiconductor package 100 is to be mounted. In this exemplary embodiment, the electrical connection metal 190 is illustrated to be provided only on a lower surface of the connection structure 140, but in some exemplary embodiment, an external connection terminal similar to the electrical connection metal 190 may also be provided on the second redistribution layer 165, i.e., on the first and second pads P1 and P2.

The connection via employed in this exemplary embodiment is illustrated as including the second via extending in the horizontal direction, relative to the first via, and connected to the redistribution pattern, but the present disclosure is not limited thereto. For example, without forming the second via to extend to have an area larger than that of the first via, the second via may be connected to the redistribution pattern, by offsetting the center of the second via from the center of the first via.

Figure 12A:
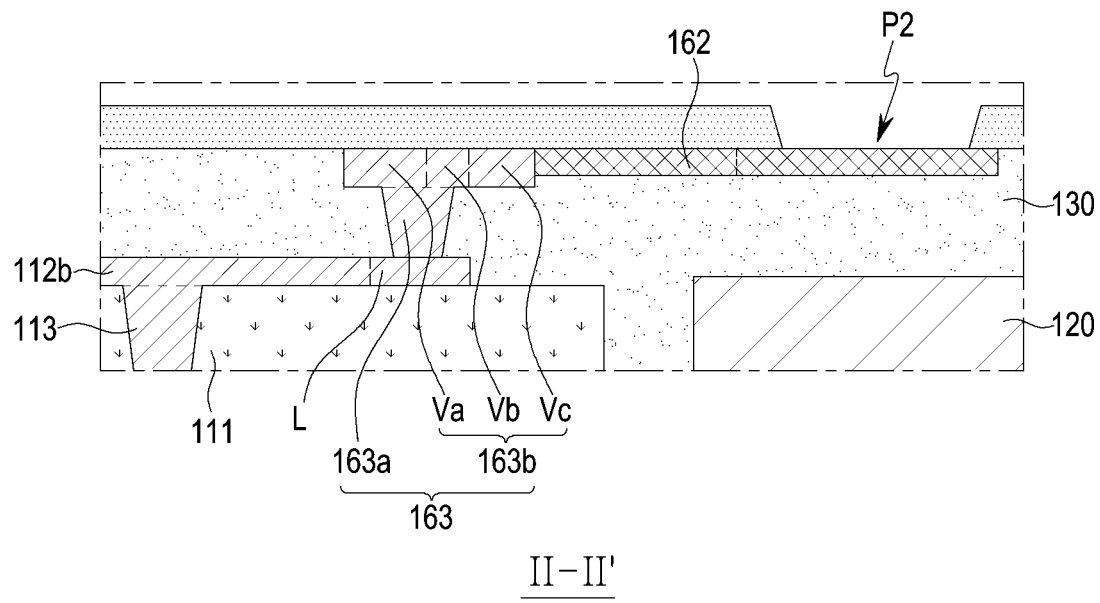
FIGS. 12A and 12B are an enlarged side cross-sectional view and an enlarged plan view, respectively, illustrating a partial region of a semiconductor package according to an exemplary embodiment in the present disclosure.
Figure 12B:
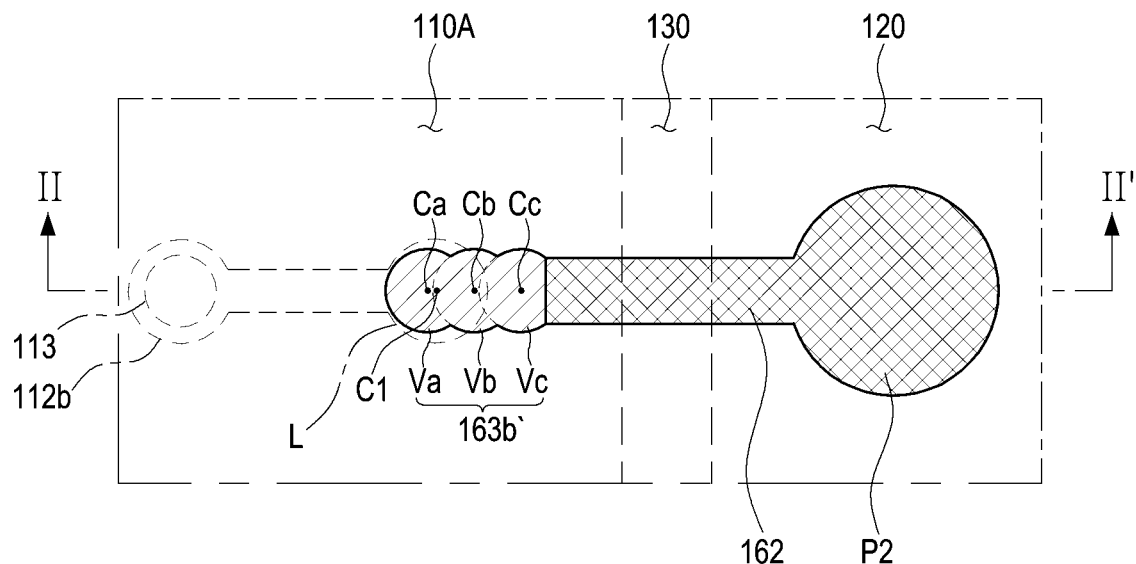

In a specific example, as illustrated in FIGS. 12A and 12B, the second via 163b may be realized as a plurality of vias Va, Vb, and Vc arranged such that the centers Ca, Cb, and Cc thereof are offset from each other. The enlarged view illustrated in FIGS. 12A and 12B may be understood as a portion corresponding to the portion A in FIG. 9.

Although the plurality of vias Va, Vb, and Vc constituting the second vias are not formed to have a larger area than the first vias 163a, the plurality of vias Va, Vb, and Vc may be connected to the second redistribution pattern 162 by forming the plurality of vias Va, Vb, and Vc to partially overlap each other and offsetting the centers Ca, Cb, and Cc little by little toward the second redistribution pattern 162. Since one via Va among the plurality of vias Va, Vb, and Vc is connected to the land L of the second wiring pattern 112b, the second wiring pattern 112b and the second redistribution pattern 162 spaced apart from each other may be stably connected.

In some exemplary embodiments, the plurality of vias Va, Vb, Vc are formed using the same laser beam and therefore may have approximately the same size, and similarly, they may have the substantially same size as the first vias 163a.

Figure 13A:
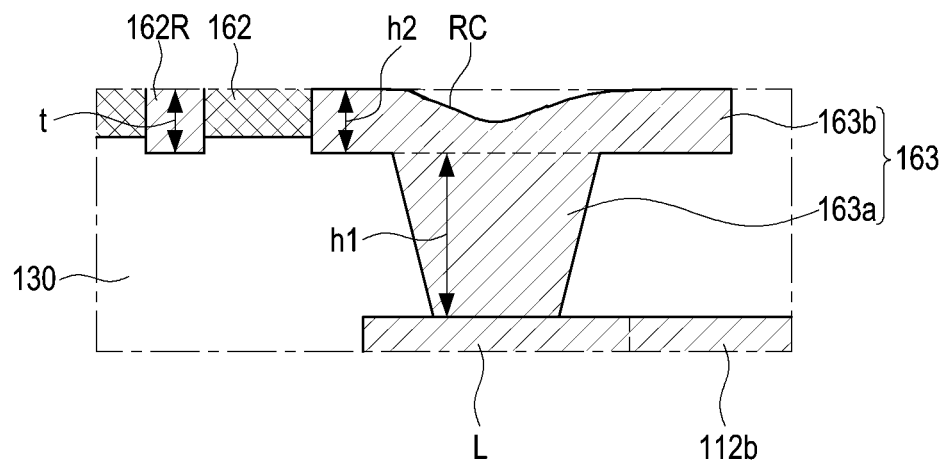
FIGS. 13A and 13B are an enlarged side cross-sectional view and an enlarged plan view, respectively, illustrating a partial region of a semiconductor package according to an exemplary embodiment in the present disclosure.
Figure 13B:
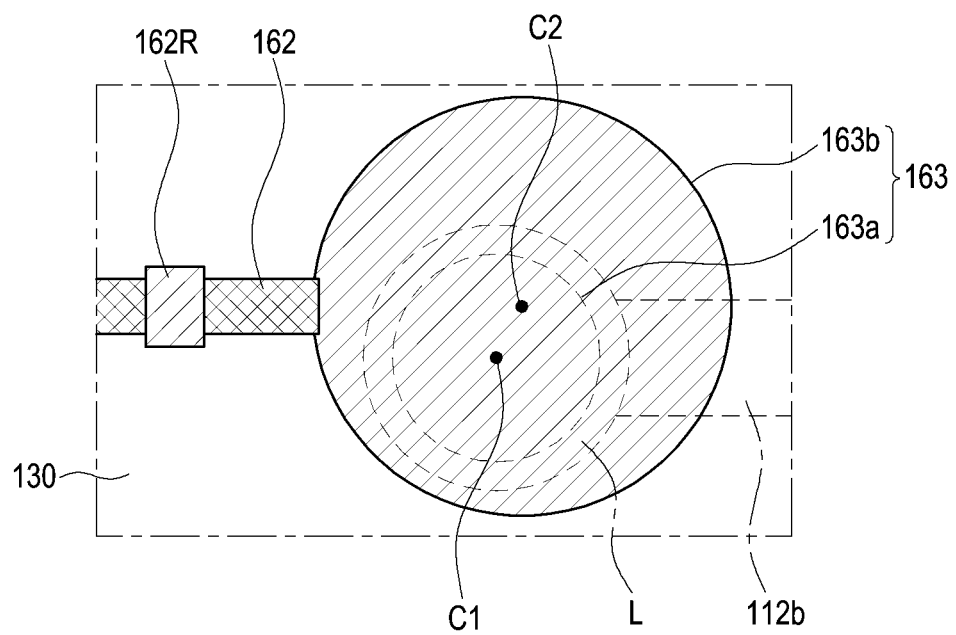

FIGS. 13A and 13B are an enlarged side cross-sectional view and an enlarged plan view, respectively, illustrating a partial region of the semiconductor package according to an exemplary embodiment in the present disclosure.

Referring to FIGS. 13A and 13B, a portion of the redistribution pattern 162 has a repair portion 162R filled with the same metal as the connection via 163. Regarding the repair portion 162R, as a short-circuited portion of the redistribution pattern 162, after the redistribution pattern 162 is laminated to be embedded in the encapsulant 130, a region of the encapsulant 130 corresponding to a short-circuited portion is removed during a hole forming process (see FIG. 15B) for the second via 163b and may be repaired during a plating process (see FIG. 15C) for the connection via 163, and the redistribution pattern may be normally connected by the plated-filled repair portion 162R through a planarization process (see FIG. 15D). Accordingly, a thickness t of the repair portion 162R may be substantially equal to the height h2 of the second via 163b.

Meanwhile, as illustrated in FIG. 13A, although the connection via 163 is planarized after being filled, an upper surface RC in which a portion adjacent to the center C1 of the first via 163a which is relatively deep is recessed may remain.

FIGS. 14A through 14F are cross-sectional views illustrating major processes of a method of manufacturing the semiconductor package illustrated in FIG. 9. In the following description of the method of manufacturing the semiconductor package 100, redundant descriptions which are the same as the above descriptions may be omitted or simplified.

Figure 14A:
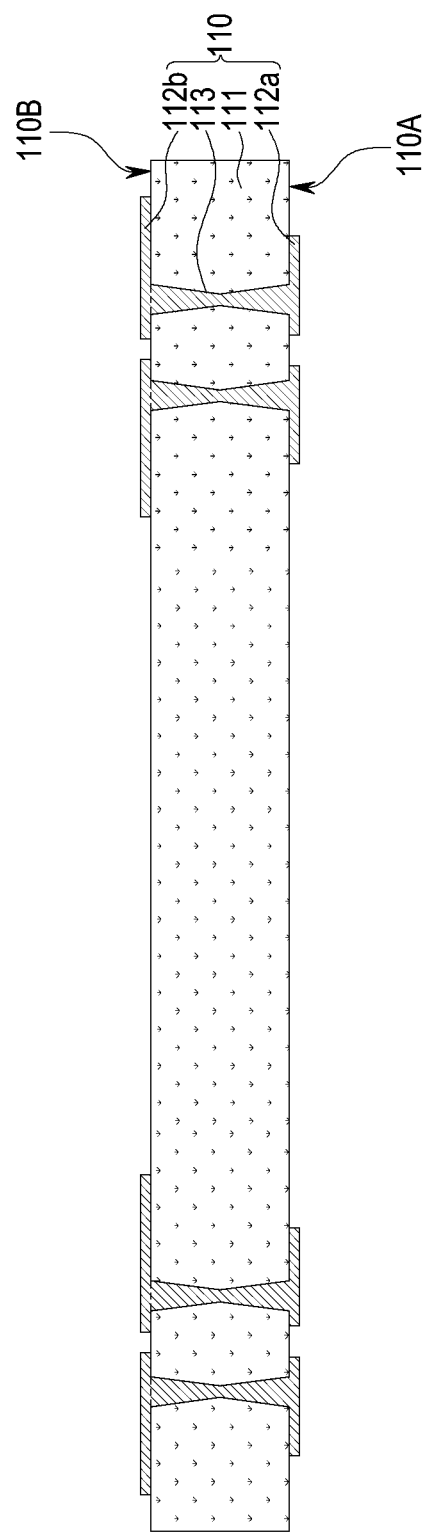
FIGS. 14A through 14F are cross-sectional views illustrating major processes of a method of manufacturing a semiconductor package illustrated in FIG. 9 (wiring layer formation and lamination process)

Referring to FIG. 14A, the wiring structure is formed on the insulating member 111 to prepare the frame 110. The insulating member 111 may be a copper clad laminate (CCL) having a thin metal layer, e.g., a copper foil (not shown) formed on upper and lower surfaces thereof. The copper foil may be used as a seed layer for pattern formation. The first and second wiring patterns 112a and 112b and the through vias 113 connecting the first and second wiring patterns 112a and 112b are formed on the insulating member 111. A hole for the through vias 113 may be formed using mechanical drilling and/or laser drilling (e.g., $CO_2$ laser or YAG laser). A resin smear in the hole (not shown) may be removed by performing desmearing. The through vias 113 and the first and second wiring patterns 112a and 112b may be formed by electrolytic copper plating or electroless copper plating using a dry film pattern. More specifically, the through vias 113 and the first and second wiring patterns 112a and 112b may be formed using a method such as subtractive, additive, semi-additive process (SAP), modified semi-additive process (MSAP), or the like, but is not limited thereto, and may be formed by chemical vapor deposition (CVD), physical vapor deposition (PVD), or sputtering, if necessary.

Figure 14B:
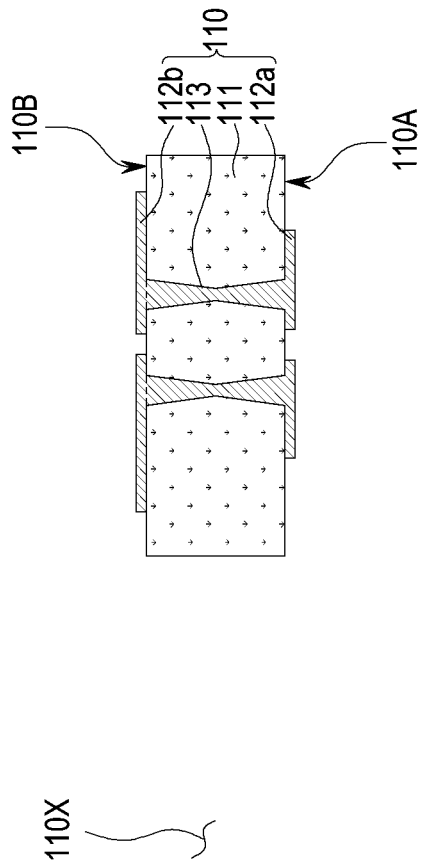
Figure 14B:
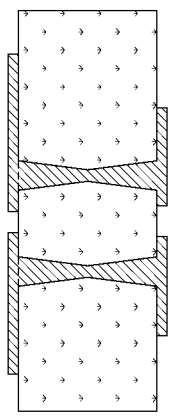

Referring to FIG. 14B, a cavity 110X penetrating through the first and second surfaces 110A and 110B of the frame 110 is formed.

A method of forming the cavity 110X is also not limited and the cavity 110X may be formed by, for example, mechanical drilling and/or laser drilling, a sand blast method using abrasive particles, a dry etching method using plasma, or the like. In case where the cavity 110X is formed using mechanical drilling and/or laser drilling, the resin smear in the cavity 110X may be removed by performing desmearing. A size and shape of the cavity 110X may be designed according to a size, a shape and the number of the semiconductor chips 120 (FIG. 14C) to be mounted.

Figure 14C:
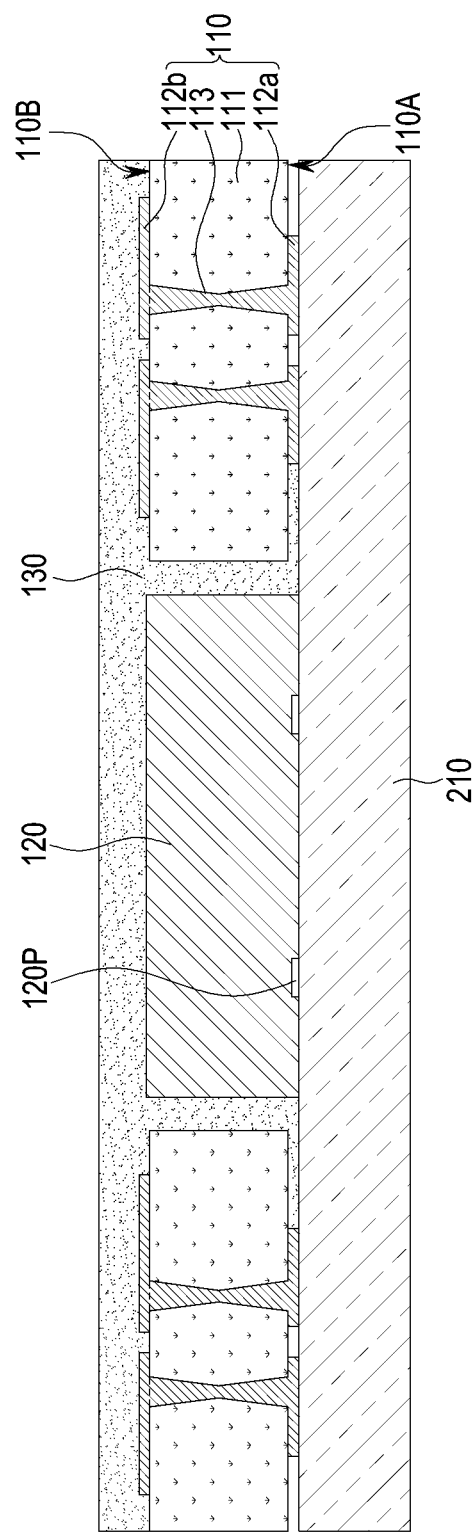

Next, referring to FIG. 14C, after an adhesive support 210 is adhered to the second surface 110B of the frame 110, the semiconductor chip 120 is placed in the cavity 110X, an encapsulant 130 for encapsulating the semiconductor chip 120 is formed.

The adhesive support 210 may be various supporting parts having an adhesive surface capable of fixing the frame 110. For example, various types of adhesive tapes such as a heat-curable adhesive tape whose adhesion is weakened by a heat treatment, an ultraviolet-curable adhesive tape whose adhesion is weakened by ultraviolet irradiation, or the like, may be used as the adhesive support 210.

The semiconductor chip 120 may be adhered to the adhesive support 210 in the cavity 110X. The connection pad 120P of the semiconductor chip 120 may be adhered to the adhesive support 210 (face-down). When the connection pad 120P of the semiconductor chip 120 is embedded, the first surface 110A of the frame 110 and a lower surface of the semiconductor chip 120 may be substantially coplanar. Alternatively, if the connection pad 120P of the semiconductor chip 120 protrudes, the second surface 110B of the frame 110 and a lower surface of the connection pad 120P may be substantially coplanar.

The encapsulant 130 covers the frame 110 and the semiconductor chip 120 and may fill the space in the cavity 110X. The encapsulant 130 may be formed by a known method. As an application method, for example, a screen printing method of applying ink by a squeezer, a spray printing method of misting ink and applying the same, and the like, may be used. In some exemplary embodiments, the encapsulant 130 may be formed by laminating a precursor and curing the laminated precursor.

Figure 14D:
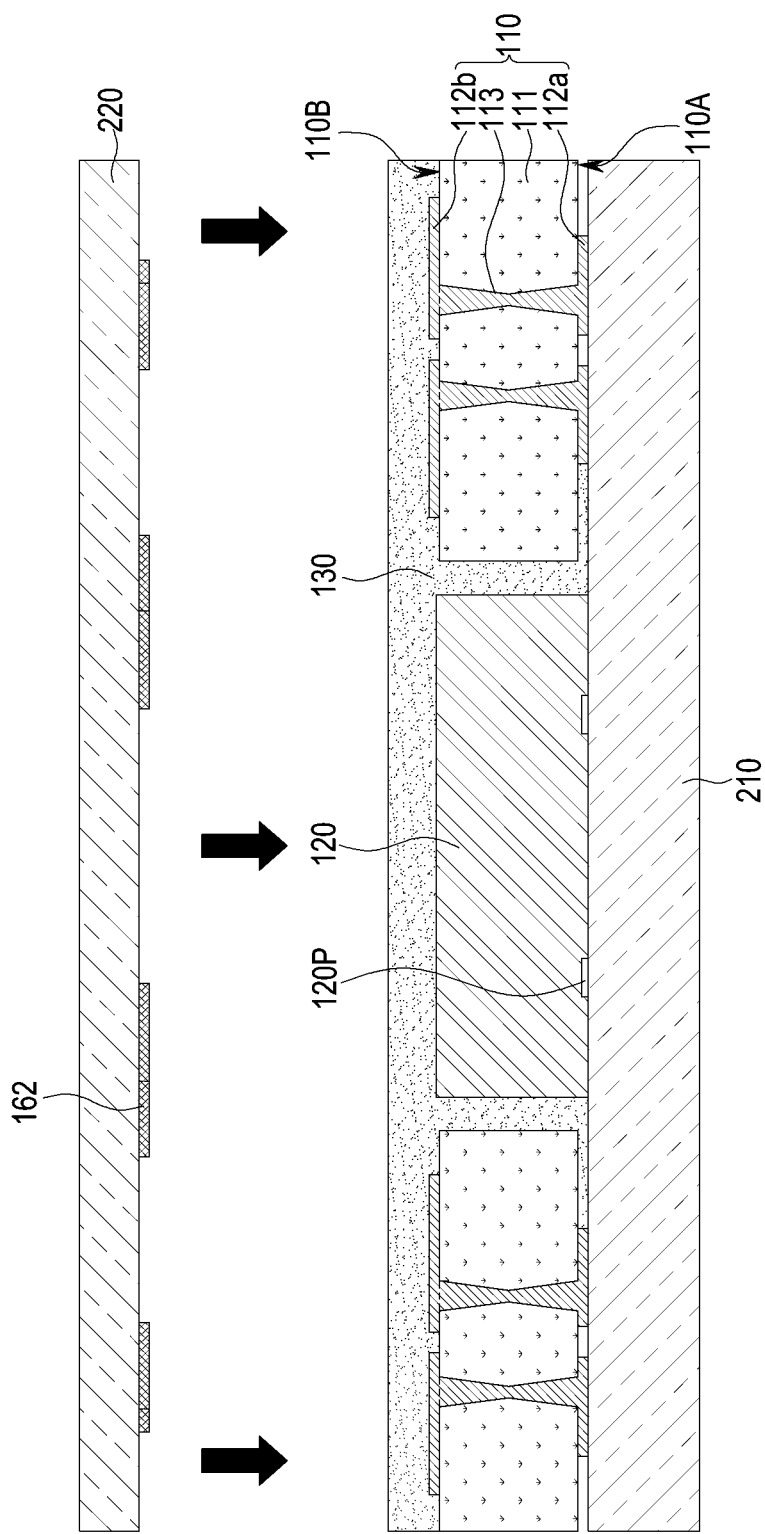
Figure 14E:
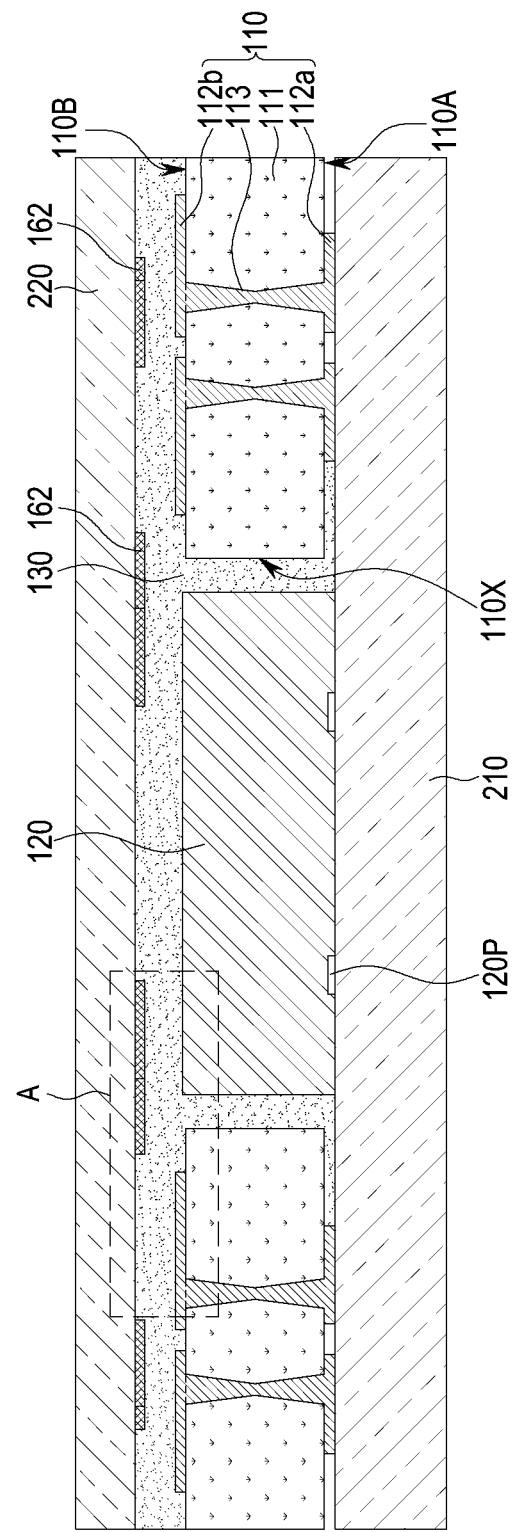

In this exemplary embodiment, in a state in which a material for forming the encapsulant 130 is applied, before the material is completely cured (i.e., a semi-cured state), the second redistribution pattern 162 prepared on a temporary support 220 may be transferred to be embedded to the surface of the encapsulant 130 (see FIGS. 14D and 14E).

Specifically, referring to FIG. 14D, the second redistribution pattern 162 prepared on the temporary support 220 may be laminated to a surface of the uncured or semi-cured encapsulant 130.

The temporary support 220 may be, but is not limited to, a copper clad laminate including a thin metal layer, e.g., a copper foil (not shown), formed on upper and lower surfaces thereof. A release layer may be formed on the copper foil or a surface treatment may be applied so that the second redistribution pattern 162 may be easily separated in a follow-up process. The second redistribution pattern 162 may be formed through plating using the copper foil as a seed layer.

This process may be performed using a rivet pin matching method, without a separate matching facility. That is, by fixing the temporary support 220, together with the adhesive support 210 or a support part thereof, by a rivet pin, a position of the second redistribution pattern 162 to be laminated in each package unit may precisely aligned. Here, although the second redistribution pattern 162 is aligned using the rivet pin, an unavoidable matching error may occur.

Next, referring to FIG. 14E, the second redistribution pattern 162 may be embedded in the surface of the encapsulant 130.

Since the encapsulant 130 is in the uncured state, for example, in the semi-cured state, the encapsulant 130 may allow the second redistribution pattern 162, which is formed to be convex with respect to the surface of the temporary support 220, to be embedded therein through the lamination process. In the case of using the lamination process, the lamination process may be carried out by hot pressing to press for a predetermined period of time at a high temperature and decompress and cool to room temperature, and subsequently cold pressing to cool additionally.

Figure 16A:
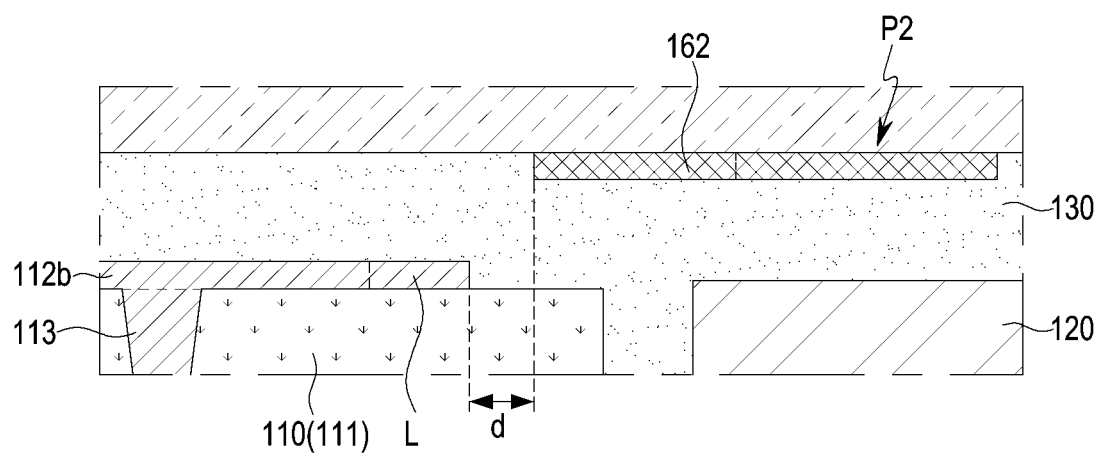
FIGS. 16A and 16B are a side cross-sectional view and a plan view, respectively, illustrating a partial region (portion A) of a redistribution layer illustrated in FIG. 14E.
Figure 16B:
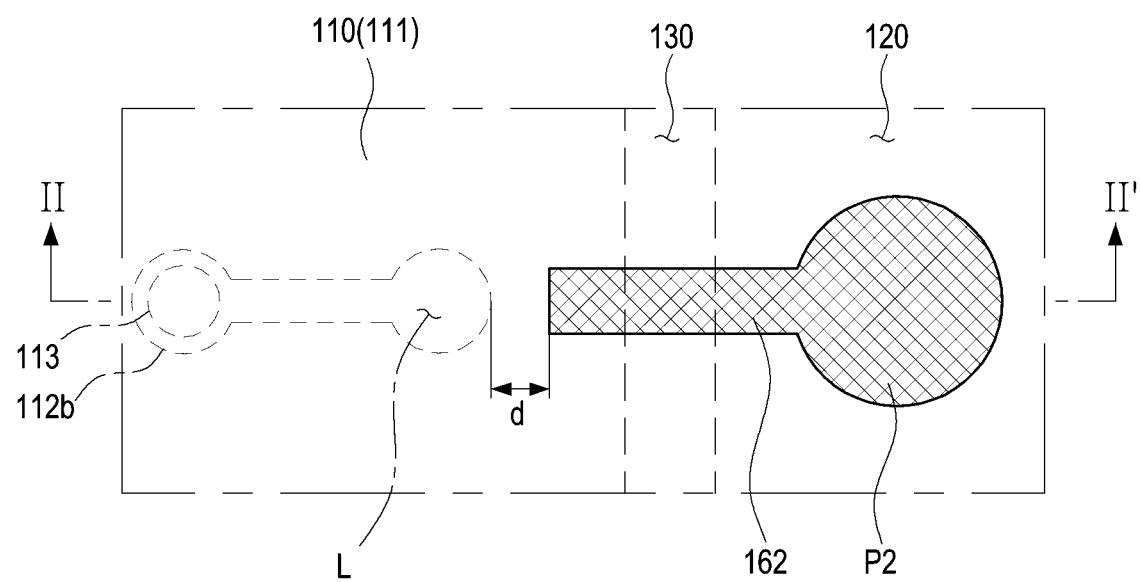

As illustrated in FIGS. 16A and 16B, the embedded second redistribution pattern 162 does not overlap the land L of the second wiring pattern 112b and may be spaced apart therefrom by a predetermined distance d in a horizontal direction. Such a distance d may increase due to the matching error mentioned above. In a state in which the second redistribution pattern 162 is embedded, a complete curing process may be performed. Even after the second redistribution pattern 162 is embedded, the temporary support 220 may be retained to be used as a support in the process of forming the first redistribution layer (or connection structure).

Figure 14F:
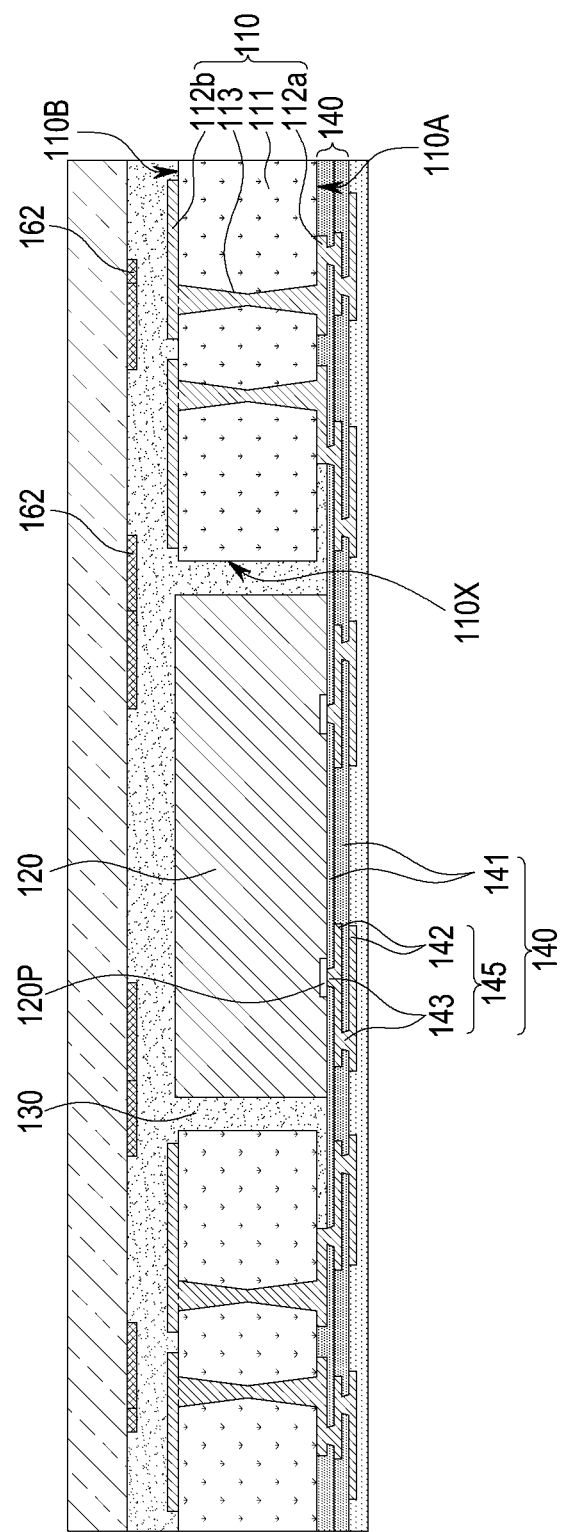

Referring to FIG. 14F, after the adhesive support 210 is removed from the frame 110 and the semiconductor chip 120, the connection structure 140 may be formed.

The removal process is not limited and may be carried out in various ways. For example, when a heat-curable adhesive tape whose adhesion is weakened by a heat treatment, an ultraviolet-curable adhesive tape whose adhesion is weakened by ultraviolet irradiation, or the like, is used as the adhesive support 210, the removal process may be performed after the adhesive support 210 is heat-treated to be weakened in adhesion or after ultraviolet rays are irradiated to the adhesive support 210 to weaken adhesion thereof. As described above, the temporary support 220 is used as a support in the process of forming the first redistribution layer.

The connection structure 140 having the first redistribution layer 145 is formed on lower surfaces of the frame 110 and the semiconductor chip 120, and the second passivation layer 172 may be formed below the connection structure 140.

After performing the above-described processes, a process of forming the second redistribution layer 165 positioned on the second surface 110B of the frame 110 may be performed. Specifically, a process of forming a connection via for connecting the embedded second redistribution pattern to the wiring structure (in particular, the second wiring pattern 112b) is performed. FIGS. 15A to 15D are cross-sectional views of major processes illustrating a process (connection via formation process) of connecting the second redistribution layer in the manufacturing method of the semiconductor package illustrated in FIG. 9.

Figure 15A:
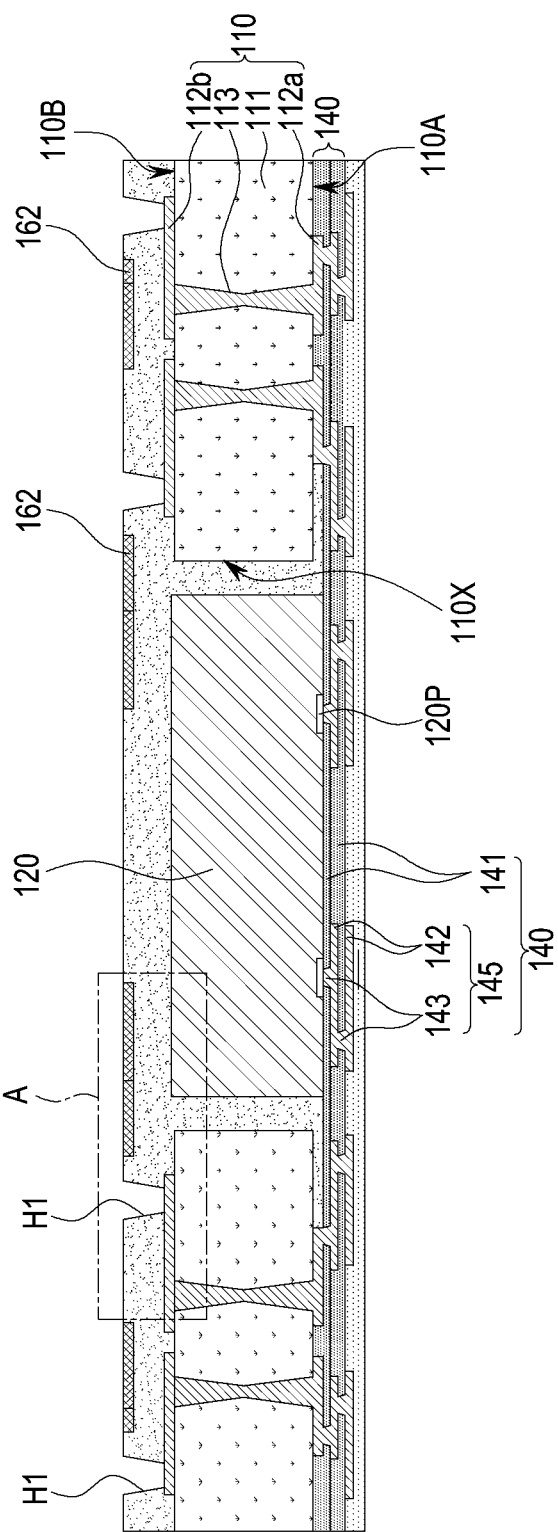
FIGS. 15A through 15D are cross-sectional views illustrating major processes of a method of manufacturing the semiconductor package illustrated in FIG. 9 (connection via formation process)

Referring to FIG. 15A, after the temporary support 220 is removed from the surface of the encapsulant 130, a first hole H1, which is connected to the land L of the second wiring pattern 112b, may be formed.

The temporary support 220 may be removed so that the embedded second redistribution pattern 162 remains on the surface of the encapsulant 130. The temporary support 220 may be easily removed using a separation part such as the release layer described above. This removal process may be easily performed after adhesion is weakened by a heat treatment, ultraviolet rays, or the like, depending on the characteristics of the temporary support or the release layer.

Figure 17A:
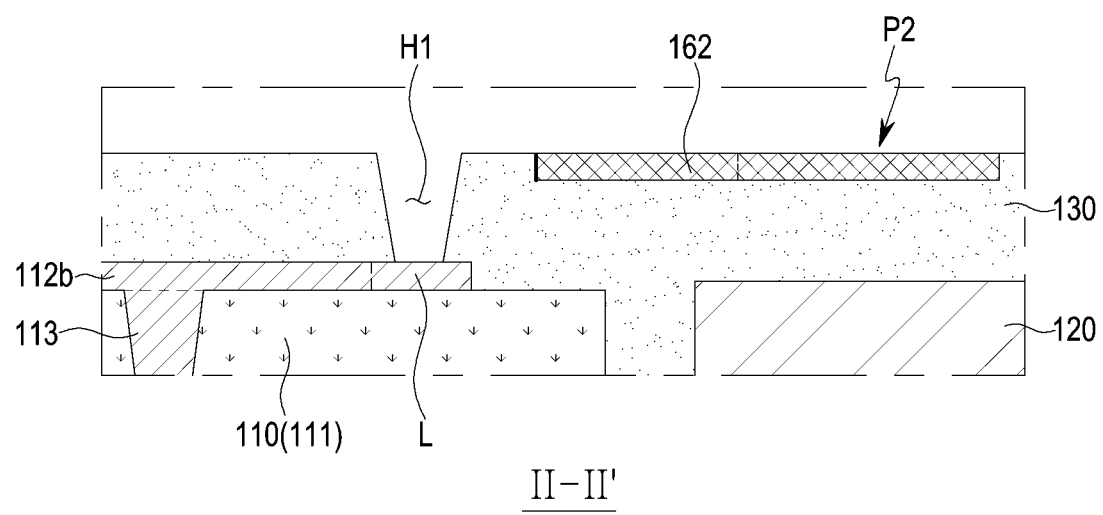
FIGS. 17A and 17B are a side cross-sectional view and a plan view, respectively, illustrating a partial region (portion A) of the redistribution layer illustrated in FIG. 15A.
Figure 17B:
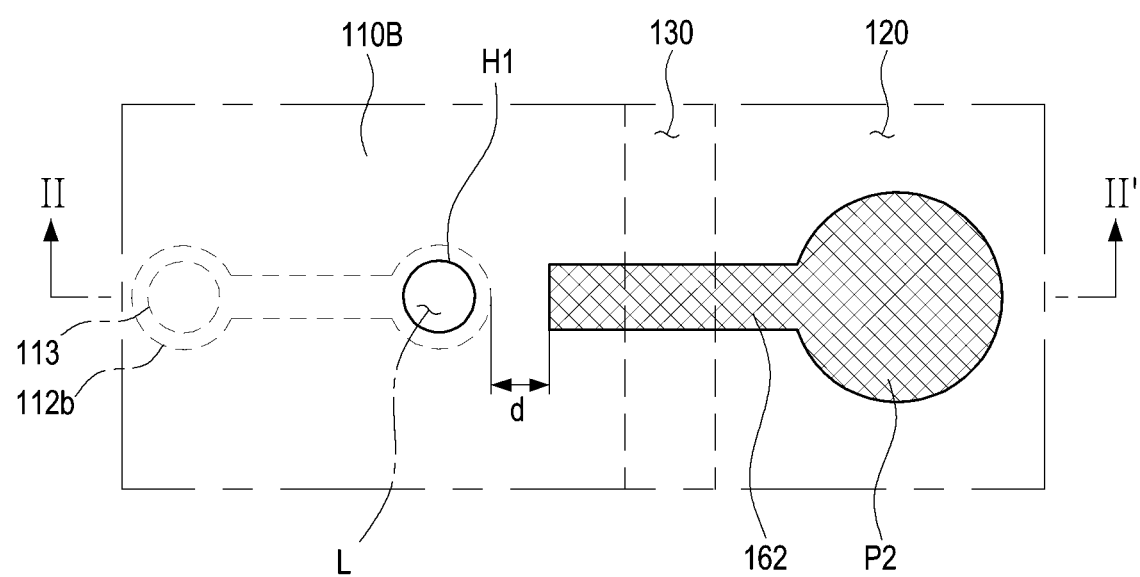

The first hole H1 for opening the land L of the second wiring pattern 112b is formed in the encapsulant. The process of forming the first hole H1 may be performed using mechanical drilling and/or laser drilling. As illustrated in FIGS. 17A and 17B, the first hole H1 may be connected to the land L of the second redistribution pattern 112b but may not be connected to the second redistribution pattern 162.

Figure 15B:
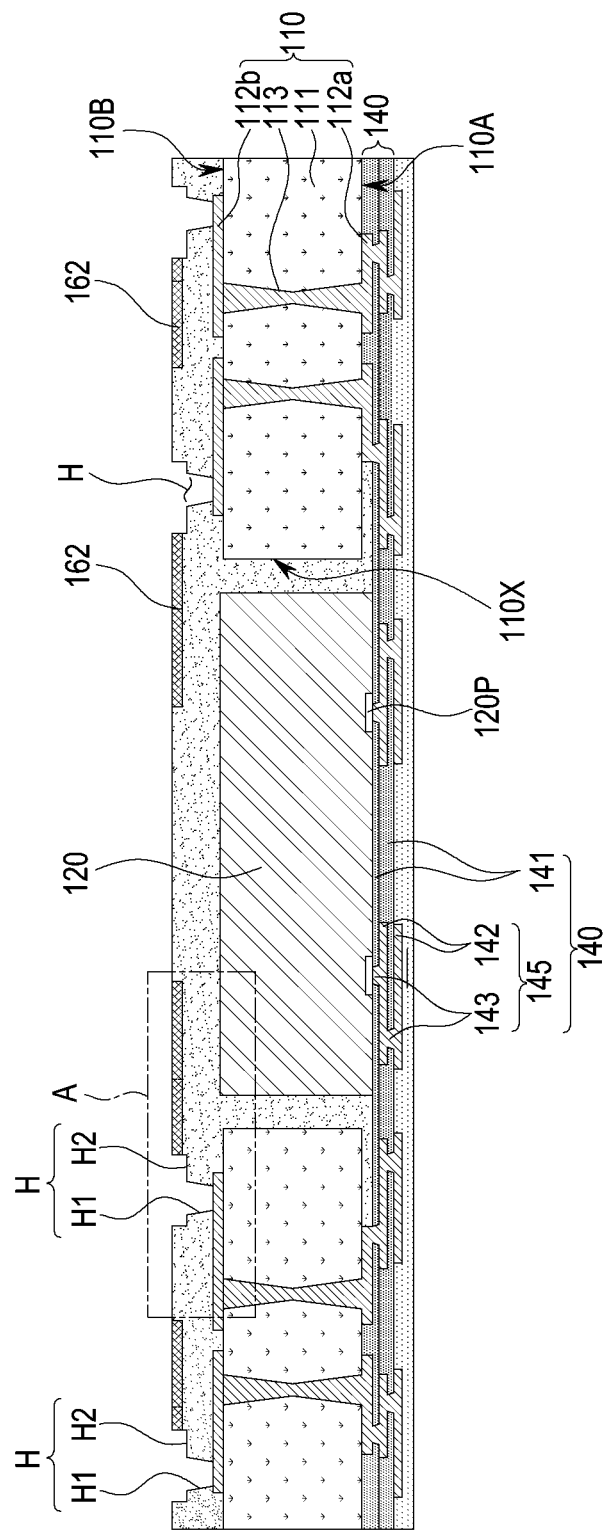

Thereafter, referring to FIG. 15B, a second hole H2 connecting the first hole H1 and the second redistribution pattern 162 may be formed.

The second hole H2 may extend an upper region of the first hole H1. For example, in the case of using a laser drilling process, the second hole H2 may be formed by expanding a laser beam size using an optical system, or the like, and adjusting the output or an irradiation time so as to have a size larger than the first hole H1 and have a depth lower than the first hole H1. After the drilling process, desmearing may be performed using a permanganate method, or the like, to remove a resin smear.

Figure 18A:
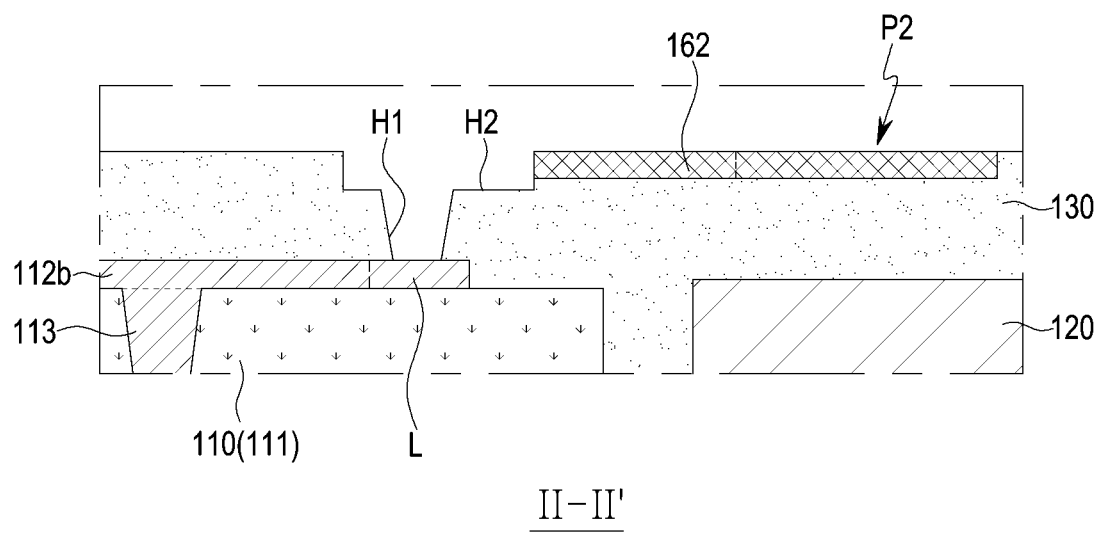
FIGS. 18A and 18B are a side cross-sectional view and a plan view, respectively, illustrating a partial region (portion A) of a redistribution layer illustrated in FIG. 15B.
Figure 18B:
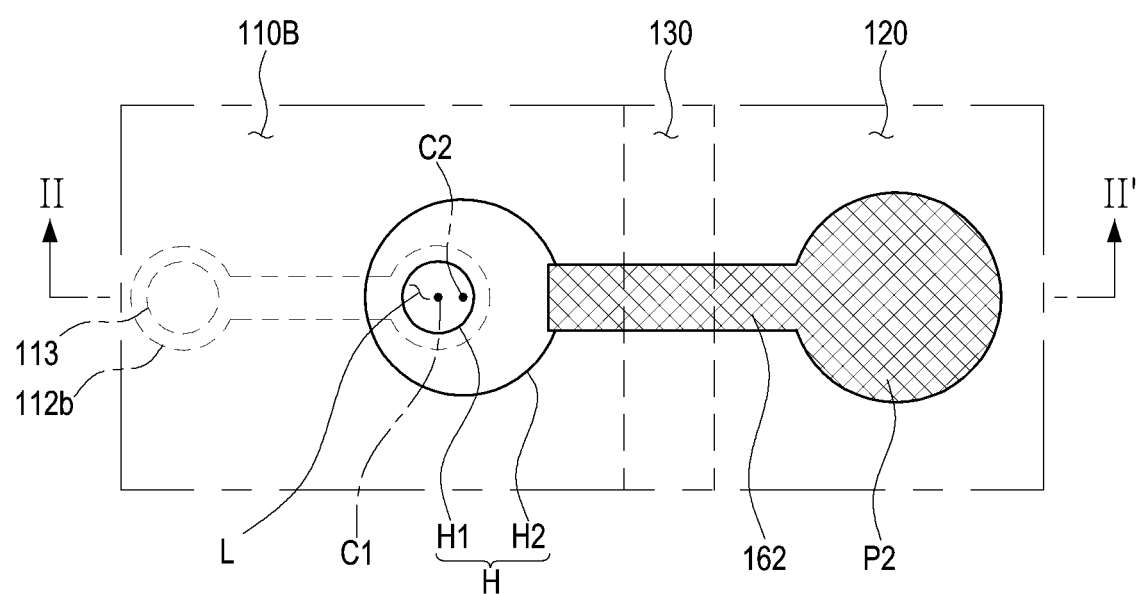

Specifically, as illustrated in FIGS. 18A and 18B, an upper region of the first hole H1 may be extended by the second hole H2 so as to be connected to the second redistribution pattern 162. In this manner, the via hole H including the first and second holes H1 and H2 may be formed to be connected from the land L to the second redistribution pattern 162. Since the center C2 of the second hole H2 is located closer to the connecting portion of the second redistribution pattern 162 than the center C1 of the first hole H1, a cross-section of the hole H1 for a connection via may have a bilateral asymmetric structure when viewed from a side cross-section (see FIG. 18B) connecting the two centers C1 and C2.

In another exemplary embodiment, the second hole H2 may be formed as a plurality of holes corresponding to the plurality of vias Va, Vb, and Vc, as illustrated in FIGS. 12A and 12B. The plurality of holes may partially overlap each other and may be arranged toward the connection portion of the second redistribution pattern 162. Such a plurality of holes may be formed by repeatedly irradiating a laser beam with the same size.

As described above with reference to FIGS. 13A and 13B, the encapsulant 130 region located in the short-circuited portion of the second redistribution pattern 162 may be removed together in this process and may be repaired during plating (see FIG. 15C) for the connection via 163 in a follow-up process. Thus, a thickness of the encapsulant 130 region removed for the repair may be substantially equal to the depth of the second hole H2.

Figure 15C:
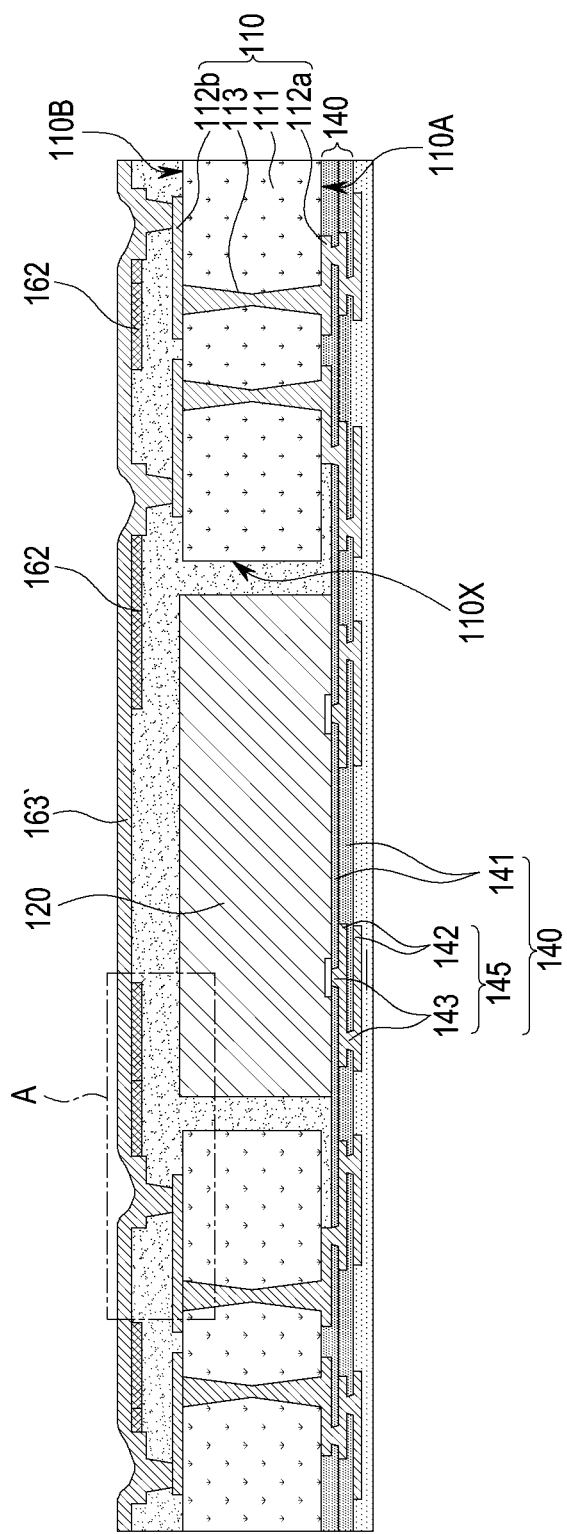

Thereafter, referring to FIG. 15C, a plating layer 163' may be formed on the encapsulant 130 so that the inside of the via hole H is filled.

In this process, the seed layer 163S is formed on the surface of the encapsulant 130 including the inner surface of the via hole H (see FIG. 19), and then the plating layer 163' is formed through plating using the seed layer. The plating layer 163' may fill the internal space of the via hole H.

Figure 19:
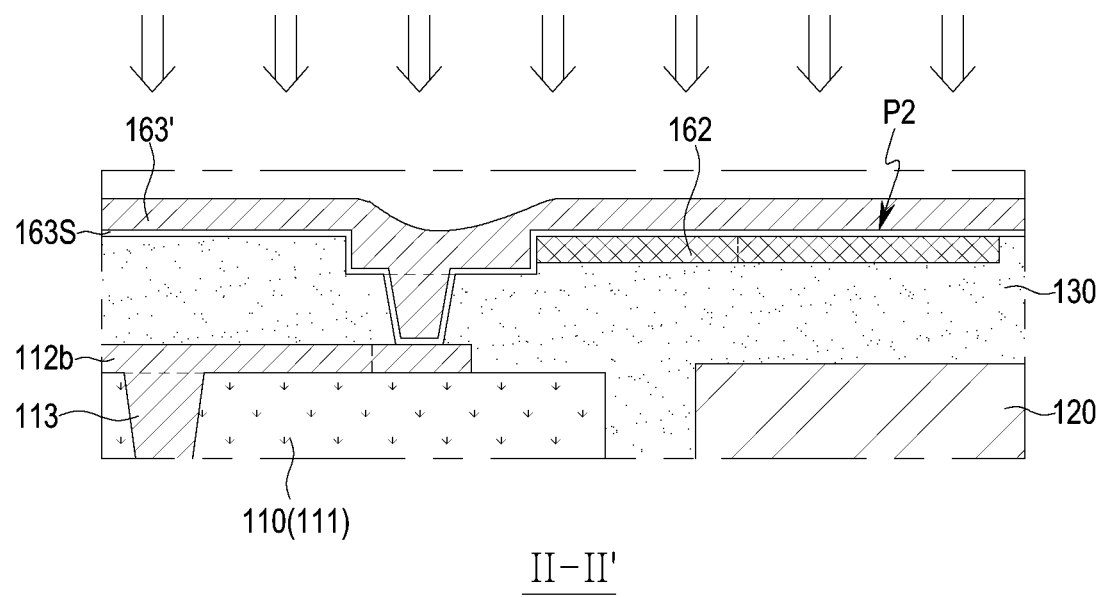
FIGS. 19 and 20 are side cross-sectional views illustrating a partial region portion (portion A) of a redistribution layer illustrated in FIGS. 15C and 15D, respectively.

Specifically, as illustrated in FIG. 19, the plating layer 163' may fill the internal space of the via hole H, and here, a region corresponding to the via hole H is slightly recessed. Also, the second redistribution pattern 162 does not have a ring-shaped land, and since the inlet of the via hole H1 has a large size due to the extended second hole H2, the internal space of the hole H may be substantially completely filled during plating. That is, since the relatively large inlet is not blocked during the filling process, the via hole H may be filled without a seam void.

Figure 15D:
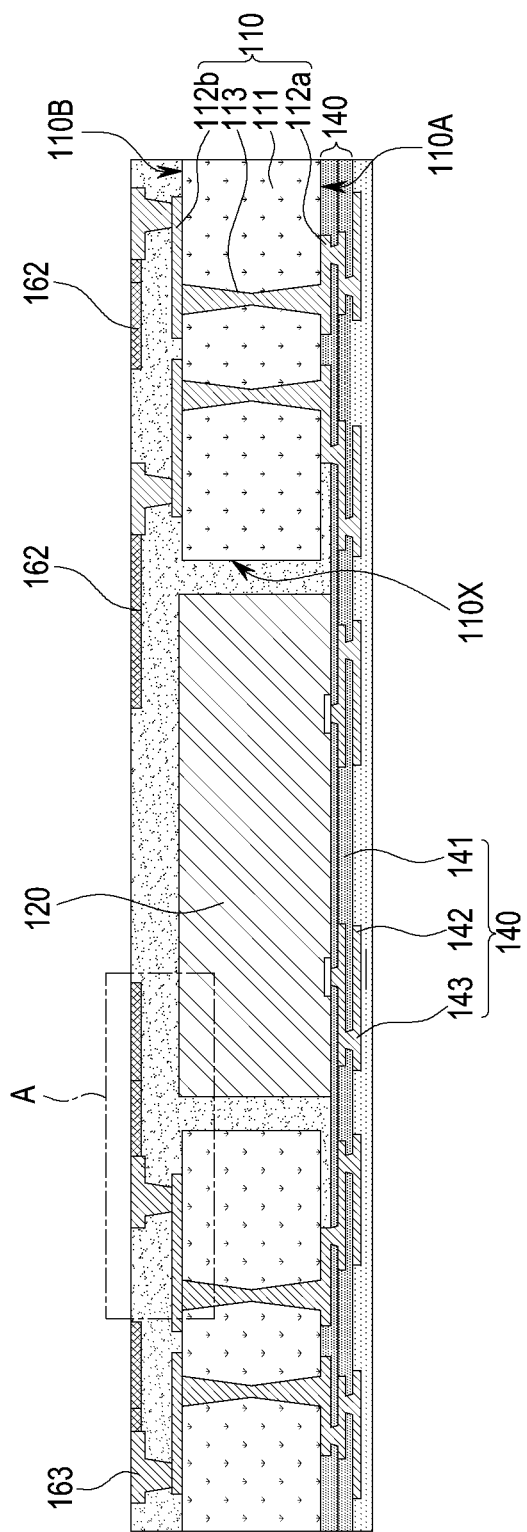

Next, referring to FIG. 15D, a portion of the plating layer located on the encapsulant 130 is removed so that the connection via 163 is formed.

Figure 20:
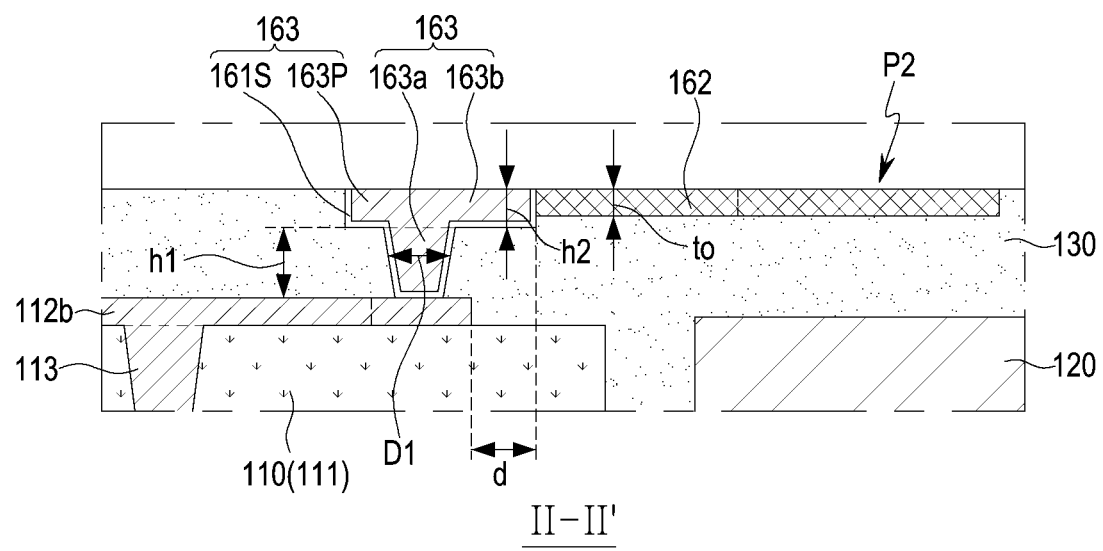

Such a removal process may be performed as a planarization process such as etch-back or grinding. The plating layer portion remaining in the via hole H may be provided as the connection via 163. The connection via 163 may connect the second wiring pattern 112b of the wiring structure and the second redistribution pattern 162. Specifically, as illustrated in FIG. 20, the connection via 163 may include the first via 163a connected to the wiring structure and the second via 163b disposed on the first via 163a and extending in the horizontal direction so as to be connected to the second redistribution pattern 162. The first and second vias 163a and 163b may be integrated. The connection via 163 may provide a desired second redistribution layer 165 together with the second redistribution pattern 162.

The connection via 163 includes the seed layer 163S located at an interface with the encapsulant 130 and the plating layer 163P formed on the seed layer 163S. The seed layer 163S is formed to extend from the bottom surface and the side surface of the first via 163a to the side surface of the second via 163b. In particular, the seed layer 163S may be located at the interface between the second via 163b and the second redistribution pattern 162 and also between the interface between the second via 163b and the encapsulant 130, and actually, the interface between the second via 163b and the second redistribution pattern 162 may be observed.

By this process, the exposed surface of the second redistribution pattern 162 may be substantially coplanar with the surface of the encapsulant 130. In this exemplary embodiment, the upper surface of the connection via 163 may have a planarized upper surface, but if the recessed portion illustrated in FIG. 19 is formed to be deep, the upper surface of the connection via 163 may have a recessed portion RC adjacent to a central axis of the first via 163a as illustrated in FIG. 13A even after the planarization process.

The connection via 163 employed in the present exemplary embodiment provides a scheme of stably connecting the land located below and the redistribution pattern located above although mismatching occurs during the lamination process. Therefore, it is not necessary to expand the area of the land located below in consideration of mismatching (i.e., matching error), and thus, a circuit pattern located at the land level may be formed with high density. Further, since a ring-shaped structure is not required to be employed in the redistribution pattern connected to the land, occurrence of a seam void in the connection via connecting the land and the redistribution pattern may be suppressed.

In the follow-up processes, after the first passivation layer 171 is formed in a similar manner to the second passivation layer 172, the plurality of first and second openings O1 and O2 are formed in the first and second passivation layers 171 and 172, respectively, the electrical connection metal 190 is formed in the UBM layer 180 located in the second opening O2, thus manufacturing the semiconductor package 100 illustrated in FIG. 9. If necessary, an electrical connection metal may be additionally formed in the second opening O2.

As set forth above, according to some exemplary embodiments of the present disclosure, the scheme of stably connecting the land located below and the redistribution pattern located above although mismatching occurs during the lamination process may be provided. Therefore, it is not necessary to expand the area of the land located below in consideration of mismatching, and thus, a circuit pattern located at the land level may be formed with high density.

Further, according to some exemplary embodiments, a ring-shaped structure is not required to be employed in the redistribution pattern connected to the land, and thus, occurrence of a seam void in the connection via connecting the land and the redistribution pattern may be suppressed.

While exemplary embodiments have been shown and described above, it will be apparent to those skilled in the art that modifications and variations could be made without departing from the scope of the present disclosure as defined by the appended claims.

What is claimed is:

1. A semiconductor package comprising:
a frame having a cavity and having a wiring structure electrically connecting first and second surfaces opposing each other;
a connection structure disposed on the first surface of the frame and including a first redistribution layer electrically connected to the wiring structure;
a semiconductor chip disposed on the connection structure in the cavity and having a connection pad electrically connected to the first redistribution layer;
an encapsulant encapsulating the semiconductor chip located in the cavity and covering the second surface of the frame; and
a second redistribution layer having a redistribution pattern embedded in the encapsulant and exposed from one surface thereof and a connection via electrically connecting the wiring structure and the redistribution pattern through the encapsulant,
wherein the connection via includes a first via electrically connected to the wiring structure and a second via disposed on the first via and electrically connecting the redistribution pattern to the first via, a lower surface of the second via has an area larger than an area of an upper surface of the first via, and the first and second vias have an integrated structure,
wherein the redistribution pattern is disposed on a side surface of the second via, and an upper surface of the redistribution pattern and an upper surface of the second via are coplanar, and
wherein the connection via includes a seed layer positioned at an interface with the encapsulant and a plating layer disposed on the seed layer, and the seed layer extends from a bottom surface and a side surface of the first via to the side surface of the second via, and has an extension portion between and in direct contact with the side surface of the second via and the side surface of the redistribution pattern.

2. The semiconductor package of claim 1, wherein the redistribution pattern is electrically connected to a region of an outer periphery of the second via.

3. The semiconductor package of claim 1, wherein a center of the second via is offset from a center of the first via.

4. The semiconductor package of claim 3, wherein the center of the second via is positioned to be closer to a connected portion of the redistribution pattern than the center of the first via.

5. The semiconductor package of claim 1, wherein the second via includes a plurality of vias respectively having circular shapes in a top plan view, the plurality of vias being arranged such that the circular shapes of the plurality of vias partially overlap each other in a horizontal direction.

6. The semiconductor package of claim 1, wherein the second via has a height different from a thickness of the redistribution pattern.

7. The semiconductor package of claim 1, wherein the connection via has an upper surface in which a portion adjacent to a center of the first via is recessed.

8. The semiconductor package of claim 1, wherein an exposed surface of the redistribution pattern is substantially coplanar with an upper surface of the encapsulant.

9. The semiconductor package of claim 1, wherein a portion of the redistribution pattern has a repair portion filled with the same metal as that of the connection via.

10. The semiconductor package of claim 9, wherein the repair portion has substantially the same thickness as a height of the second via.

11. The semiconductor package of claim 9, wherein the repair portion includes the plating layer, and the seed layer between the plating layer and the encapsulant and between the plating layer and the redistribution pattern.

12. The semiconductor package of claim 1, wherein
the first and second redistribution layers have a plurality of first and second pad regions, respectively, and
the semiconductor package further comprising:
a first passivation layer disposed on a surface of the encapsulant and having openings exposing the plurality of first pad regions and a second passivation layer disposed on a lower surface of the connection structure and having openings exposing the plurality of second pad regions.

13. A semiconductor package comprising:
a frame having a cavity and having a wiring structure electrically connecting first and second surfaces opposing each other;
a connection structure disposed on the first surface of the frame and including a first redistribution layer electrically connected to the wiring structure;
a semiconductor chip disposed on the connection structure in the cavity and having a connection pad electrically connected to the first redistribution layer;
an encapsulant encapsulating the semiconductor chip located in the cavity and covering the second surface of the frame; and
a second redistribution layer having a redistribution pattern embedded in the encapsulant and exposed from one surface thereof and a connection via electrically connecting the wiring structure and the redistribution pattern through the encapsulant,
wherein the connection via includes a first via electrically connected to the wiring structure and a second via disposed on the first via, having a center offset from a center of the first via, and electrically connected to the redistribution pattern,
wherein the redistribution pattern is disposed on a side surface of the second via, and an upper surface of the redistribution pattern and an upper surface of the second via are coplanar, and
wherein the connection via includes a seed layer positioned at an interface with the encapsulant and a plating layer disposed on the seed layer, and the seed layer extends from a bottom surface and a side surface of the first via to the side surface of the second via, and has an extension portion between and in direct contact with the side surface of the second via and the side surface of the redistribution pattern.

14. The semiconductor package of claim 13, wherein
the center of the second via is positioned to be closer to a connected portion of the redistribution pattern than the center of the first via.

15. The semiconductor package of claim 13, wherein
the second via includes a plurality of vias respectively having circular shapes in a top plan view, the plurality of vias being arranged such that the circular shapes of the plurality of vias partially overlap each other in a horizontal direction, and the plurality of vias are arranged from the first via toward the redistribution pattern.

16. The semiconductor package of claim 13, wherein
the second via has a height different from a thickness of the redistribution pattern.

17. The semiconductor package of claim 13, wherein
a portion of the redistribution pattern has a repair portion filled with the same metal as that of the connection via.

* * * * *